US011991932B2

(12) United States Patent
Chang et al.

(10) Patent No.: US 11,991,932 B2
(45) Date of Patent: May 21, 2024

(54) POST-TREATMENT PROCESSES FOR ION BEAM ETCHING OF MAGNETIC TUNNEL JUNCTION AND STRUCTURES FORMED BY THE SAME

(71) Applicant: Taiwan Semiconductor Manufacturing Company Limited, Hsinchu (TW)

(72) Inventors: Hung-Yu Chang, Hsinchu (TW); Min-Yung Ko, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 318 days.

(21) Appl. No.: 17/323,181

(22) Filed: May 18, 2021

(65) Prior Publication Data

US 2022/0020917 A1  Jan. 20, 2022

Related U.S. Application Data

(60) Provisional application No. 63/053,025, filed on Jul. 17, 2020.

(51) Int. Cl.
*H10B 61/00* (2023.01)
*G11C 11/16* (2006.01)
(Continued)

(52) U.S. Cl.
CPC ........... *H10N 50/80* (2023.02); *G11C 11/161* (2013.01); *H01F 10/3254* (2013.01);
(Continued)

(58) Field of Classification Search
None
See application file for complete search history.

(56) References Cited

U.S. PATENT DOCUMENTS 9,450,180 B1* 9/2016 Annunziata ........... G11C 11/161
10,707,413 B1* 7/2020 Dutta ..................... H10N 50/01
(Continued)

FOREIGN PATENT DOCUMENTS

CN     111261660 A    6/2020
JP     2020047732 A    3/2020
(Continued)

OTHER PUBLICATIONS

Chinese Patent Office; Application No. 202110804095.2; First Office Action dated Sep. 26, 2023, 9 pages.

*Primary Examiner* — Kevin M Bernatz
(74) *Attorney, Agent, or Firm* — The Marbury Law Group, PLLC

(57) ABSTRACT

A magnetic tunnel junction device includes a pillar structure including, from bottom to top, a bottom electrode and a magnetic tunnel junction structure, a top electrode overlying the magnetic tunnel junction structure, and a dielectric metal oxide layer extending from a sidewall of the pillar structure to a sidewall of the top electrode. The magnetic tunnel junction structure contains a reference magnetization layer including a first ferromagnetic material, a tunnel barrier layer, and a free magnetization layer including a second ferromagnetic material. The top electrode includes a metallic material containing a nonmagnetic metal element. The dielectric metal oxide layer may be formed by performing an oxidation process that oxidizes a residual metal film after a focused ion beam etch process, and eliminates conductive paths from surfaces of the pillar structure.

20 Claims, 24 Drawing Sheets

(51) Int. Cl.
  *H01F 10/32* (2006.01)
  *H10N 50/01* (2023.01)
  *H10N 50/10* (2023.01)
  *H10N 50/80* (2023.01)
  *H10N 50/85* (2023.01)

(52) U.S. Cl.
  CPC ......... *H01F 10/3272* (2013.01); *H10B 61/00* (2023.02); *H10B 61/22* (2023.02); *H10N 50/01* (2023.02); *H10N 50/10* (2023.02); *H10N 50/85* (2023.02)

(56) References Cited

U.S. PATENT DOCUMENTS

| | | | |
|---|---|---|---|
| 11,785,862 B2 * | 10/2023 | Liao | H10N 50/01 |
| 11,800,811 B2 * | 10/2023 | Shen | H10N 50/01 |
| 11,839,161 B2 * | 12/2023 | Hsu | H10N 50/10 |
| 2014/0248718 A1 | 9/2014 | Kim et al. | |
| 2015/0123223 A1 | 5/2015 | Kim et al. | |
| 2015/0263273 A1 | 9/2015 | Yoshikawa et al. | |
| 2016/0072051 A1 | 3/2016 | Iwayama | |
| 2016/0072055 A1 * | 3/2016 | Seto | H10N 50/01 |
| | | | 438/3 |
| 2017/0263860 A1 | 9/2017 | Seto et al. | |
| 2018/0040668 A1 * | 2/2018 | Park | H10B 61/22 |
| 2018/0366638 A1 * | 12/2018 | Lin | H10B 61/22 |
| 2018/0375019 A1 | 12/2018 | Park et al. | |
| 2019/0139959 A1 | 5/2019 | Chou et al. | |
| 2019/0140163 A1 | 5/2019 | Yun et al. | |
| 2019/0341090 A1 * | 11/2019 | Annunziata | H10N 50/80 |
| 2019/0363249 A1 * | 11/2019 | Yang | G11C 11/161 |
| 2019/0371996 A1 * | 12/2019 | Chuang | H10B 61/22 |
| 2020/0028069 A1 | 1/2020 | Nguyen et al. | |
| 2020/0176041 A1 | 6/2020 | Shen et al. | |
| 2020/0220072 A1 * | 7/2020 | Marchack | H10B 61/00 |
| 2020/0350495 A1 * | 11/2020 | Dutta | H10N 50/01 |
| 2020/0395535 A1 * | 12/2020 | Liao | H10N 50/01 |
| 2021/0119113 A1 * | 4/2021 | Marchack | H10N 50/10 |
| 2023/0165169 A1 * | 5/2023 | Buzi | H10B 63/80 |
| | | | 365/163 |
| 2023/0189660 A1 * | 6/2023 | Dutta | H10N 50/10 |
| | | | 257/421 |
| 2023/0255119 A1 * | 8/2023 | Yang | H10N 50/01 |
| | | | 257/421 |

FOREIGN PATENT DOCUMENTS

| | | |
|---|---|---|
| KR | 20200066559 A | 6/2020 |
| WO | WO 2015/141673 A1 | 9/2015 |

* cited by examiner

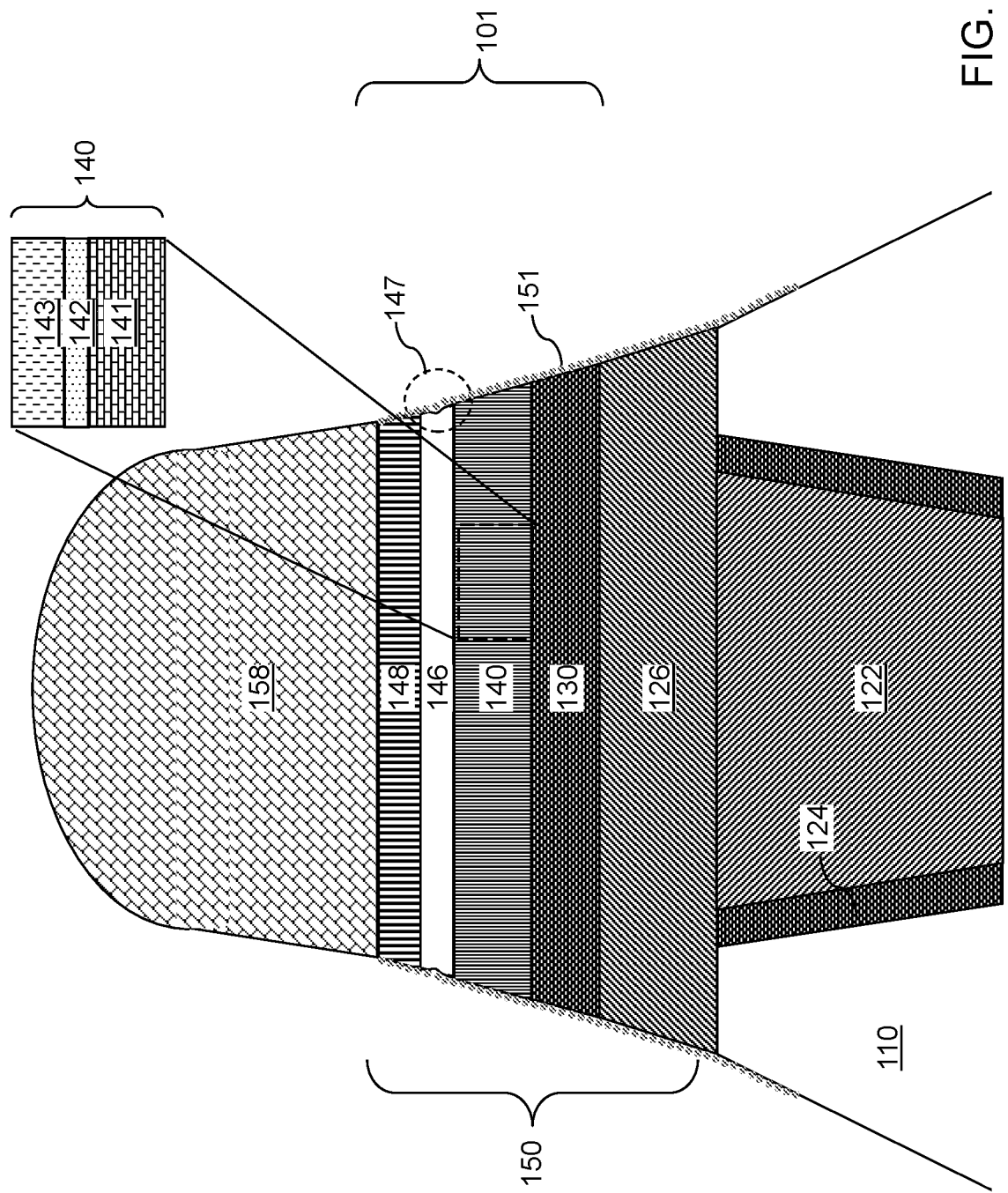

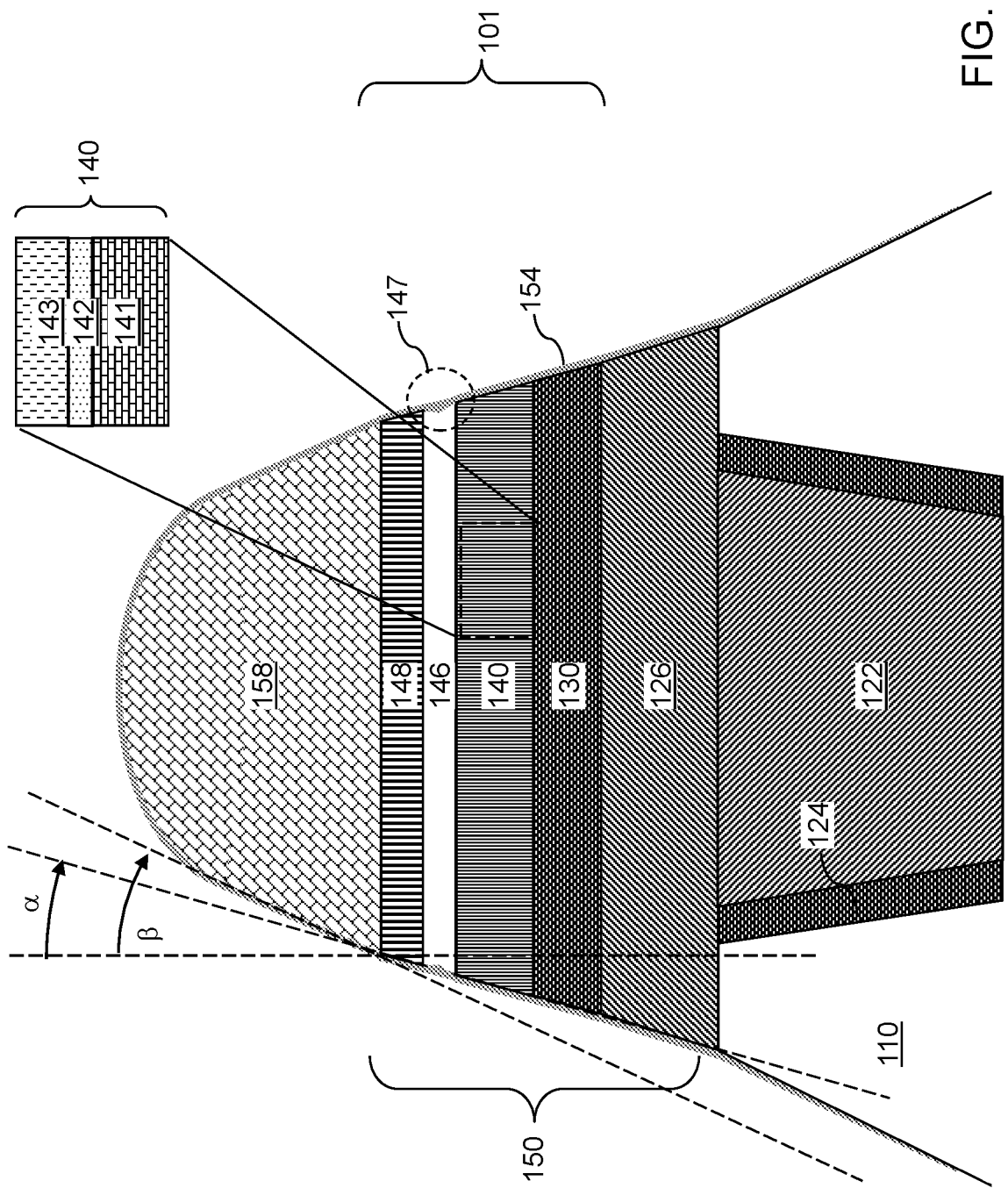

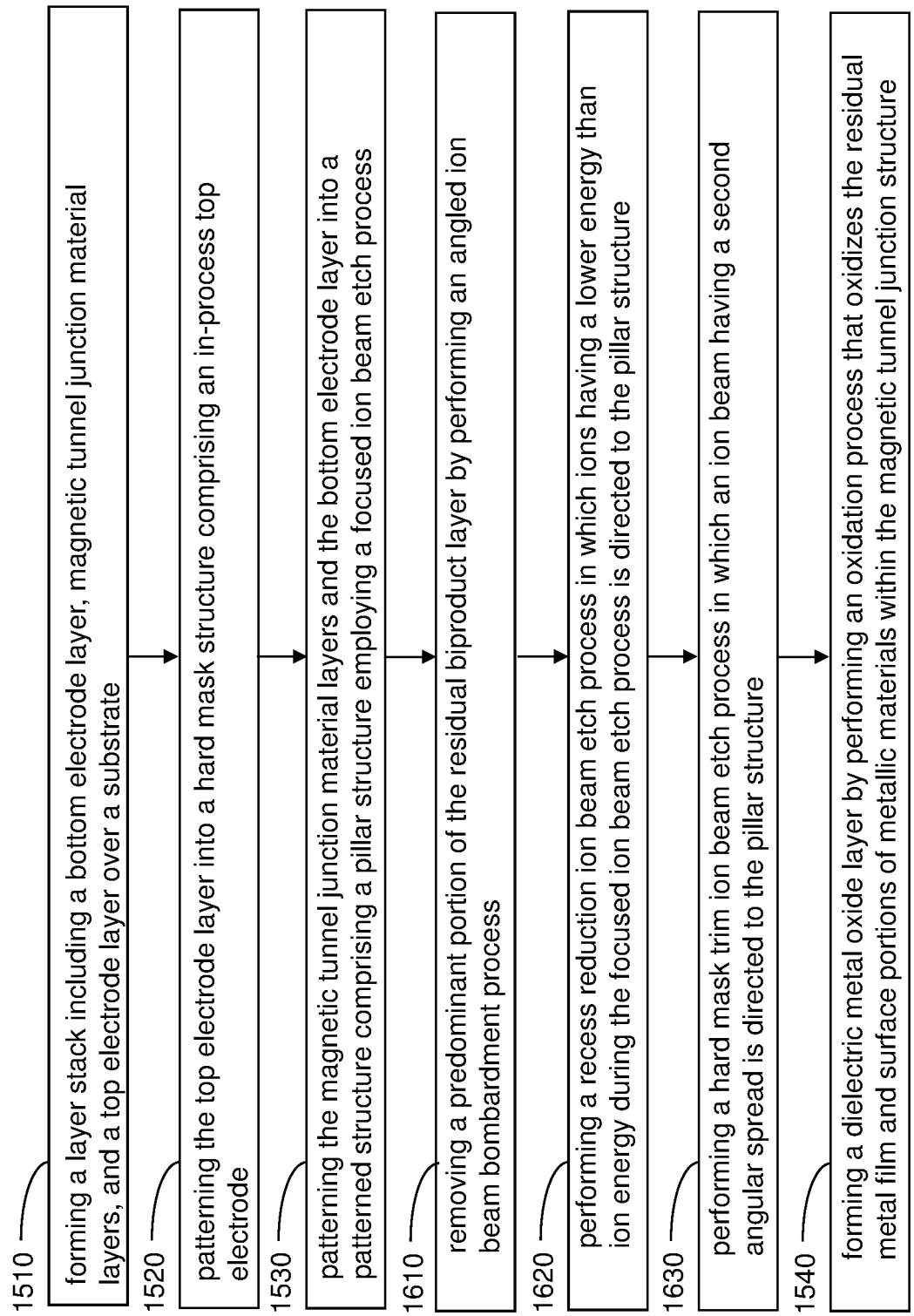

POST-TREATMENT PROCESSES FOR ION BEAM ETCHING OF MAGNETIC TUNNEL JUNCTION AND STRUCTURES FORMED BY THE SAME

RELATED APPLICATIONS

This application claims the benefit of priority from U.S. Provisional Application No. 63/053,025 entitled "Ion Beam Etching (IBE) with post-treatment and MTJ structures thereof" filed on Jul. 17, 2020, the entire contents of which are hereby incorporated by reference for all purposes.

BACKGROUND

Tunneling magnetoresistance of a magnetic tunnel junction (MTJ) depends on a relative alignment of the magnetization of a reference magnetization layer and a free magnetization layer. A magnetic tunnel junction memory devices utilizes this property to store information as encoded either as a parallel alignment of magnetization directions between the reference magnetization layer and the free magnetization layer, or as an antiparallel alignment of magnetization directions between the reference magnetization layer and the free magnetization layer. Yield and reliability are main concerns during manufacture of magnetic tunnel junction memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6E illustrate sequential vertical cross-sectional views of a memory cell during a first exemplary sequence of patterning processes according to an embodiment of the present disclosure.

FIG. 16 is a second flowchart that illustrates a second sequence of processing steps for manufacturing a magnetic tunnel junction device of the present disclosure.

DETAILED DESCRIPTION

Figure 1:
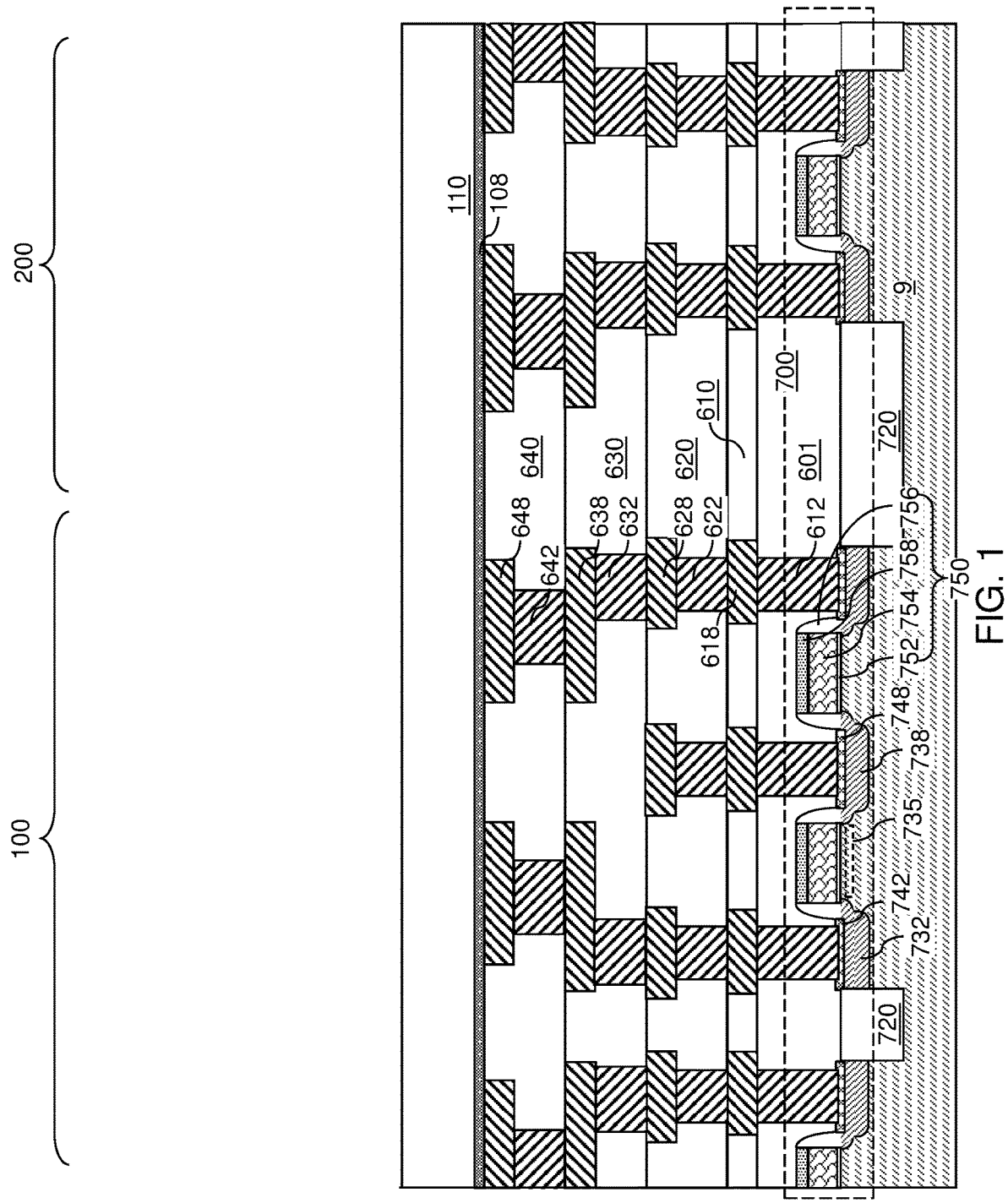
FIG. 1 is a vertical cross-sectional view of an exemplary structure after formation of complementary metal-oxide-semiconductor (CMOS) transistors, metal interconnect structures embedded in dielectric material layers, and a connection-via-level dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to form a memory cell and/or an array of memory cells. Specifically, the structures and methods of the present disclosure may be used to form a magnetic tunnel junction memory cell and/or an array of magnetic tunnel junction memory cells.

MTJ patterning through magnetized inductively coupled plasma (MICP) may cause the penetration of ions C, H, O into the magnetic layers and form a poison layer or damage layer, which lead to the degradation of tunnel magneto resistance (TMR)/coercivity (Hc). In order to prevent the generation of poison layer, ion beam etching (IBE) may be used for MTJ patterning.

A magnetic tunnel junction structure formed by ion beam etching may have many structural and electrical defects as a collateral consequence of use of a high energy ion beam. For example, various components within a magnetic tunnel junction may be electrically shorted to one another through metal particles that are byproducts of the ion beam etching process. Occurrences of such electrical shorts may be manifested in measurements on the bit error rate, which measures the error rate of memory bits that comprise physical magnetic tunnel junctions. Bit error rates on the order of about 100 parts per million are not uncommon during manufacture of magnetic tunnel junction devices. The present disclosure addresses the problem of electrical shorts and other adverse electrical characteristics induced within magnetic tunnel junction structures by using an oxidation process that converts a residual metal film on a sidewall of a magnetic tunnel junction structure into a dielectric metal oxide layer that becomes electrically inactive, thereby removing electrical short paths from the sidewall of the magnetic tunnel junction structure. The various aspects of the present disclosure are now described with reference to accompanying drawings.

FIG. 1 is a vertical cross-sectional view of an exemplary structure after formation of complementary metal-oxide-semiconductor (CMOS) transistors, metal interconnect structures embedded in dielectric material layers, and a connection-via-level dielectric layer according to an embodiment of the present disclosure. The exemplary structure includes complementary metal-oxide-semiconductor (CMOS) transistors and metal interconnect structures formed in dielectric material layers. Specifically, the exemplary structure includes a substrate 9, which may be a semiconductor substrate such as a commercially available silicon wafer. Shallow trench isolation structures 720 including a dielectric material such as silicon oxide may be formed in an upper portion of the substrate 9. Suitable doped semiconductor wells, such as p-type wells and n-type wells, may be formed within each area that may be laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal-semiconductor alloy region 742 may be formed on each source region 732, and a drain-side metal-semiconductor alloy region 748 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAAFET) transistors, or any other type of field effect transistors (FETs).

The exemplary structure may include a memory array region 100 in which an array of memory elements may be subsequently formed, and a peripheral region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the peripheral region 200 at this processing step. Devices (such as field effect transistors) in the peripheral region 200 may provide functions that may be needed to operate the array of memory cells to be subsequently formed. Specifically, devices in the peripheral region may be configured to control the programming operation, the erase operation, and the sensing (read) operation of the array of memory cells. For example, the devices in the peripheral region may include a sensing circuitry and/or a top electrode bias circuitry. The devices formed on the top surface of the substrate 9 may include complementary metal-oxide-semiconductor (CMOS) transistors and optionally additional semiconductor devices (such as resistors, diodes, capacitors, etc.), and are collectively referred to as CMOS circuitry 700.

Various metal interconnect structures embedded in dielectric material layers may be subsequently formed over the substrate 9 and the devices (such as field effect transistors). The dielectric material layers may include, for example, a contact-level dielectric material layer 601, a first metal-line-level dielectric material layer 610, a second line-and-via-level dielectric material layer 620, a third line-and-via-level dielectric material layer 630, and a fourth line-and-via-level dielectric material layer 640. The metal interconnect structures may include device contact via structures 612 formed in the contact-level dielectric material layer 601 and contact a respective component of the CMOS circuitry 700, first metal line structures 618 formed in the first metal-line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, third metal line structures 638 formed in an upper portion of the third line-and-via-level dielectric material layer 630, third metal via structures 642 formed in a lower portion of the fourth line-and-via-level dielectric material layer 640, and fourth metal line structures 648 formed in an upper portion of the fourth line-and-via-level dielectric material layer 640. In one embodiment, the second metal line structures 628 may include source lines that are connected a source-side power supply for an array of memory elements. The voltage provided by the source lines may be applied to the bottom electrodes through the access transistors provided in the memory array region 100.

Each of the dielectric material layers (601, 610, 620, 630, 640) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638, 642, 648) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Al, Co, Ru, Mo, Ta, Ti, alloys thereof, and/or combinations thereof. Other suitable materials within the contemplated scope of disclosure may also be used. In one embodiment, the first metal via structures 622 and the second metal line structures 628 may be formed as integrated line and via structures by a dual damascene process, the second metal via structures 632 and the third metal line structures 638 may be formed as integrated line and via structures, and/or the third metal via structures 642 and the fourth metal line structures 648 may be formed as integrated line and via structures. While the present disclosure is described using an embodiment in which an array of memory cells formed over the fourth line-and-via-level dielectric material layer 640, embodiments are expressly contemplated herein in which the array of memory cells may be formed at a different metal interconnect level.

The dielectric material layers (601, 610, 620, 630, 640) may be located at a lower level relative to an array of memory cells to be subsequently formed. As such, the dielectric material layers (601, 610, 620, 630, 640) are herein referred to as lower-level dielectric layers, i.e., dielectric material layer located at a lower level relative to the array of memory cells to be subsequently formed. The metal interconnect structures (612, 618, 622, 628, 632, 638, 642, 648) are herein referred to lower-level metal interconnect structures. A subset of the metal interconnect structures (612, 618, 622, 628, 632, 638, 642, 648) includes lower-level metal lines (such as the fourth metal line structures 648) that are embedded in the lower-level dielectric layers and having top surfaces within a horizontal plane including a topmost surface of the lower-level dielectric layers. Generally, the total number of metal line levels within the lower-level dielectric layers (601, 610, 620, 630, 640) may be in a range from 1 to 10.

A dielectric cap layer 108 and a connection-via-level dielectric layer 110 may be sequentially formed over the metal interconnect structures and the dielectric material layers. For example, the dielectric cap layer 108 may be formed on the top surfaces of the fourth metal line structures 648 and on the top surface of the fourth line-and-via-level dielectric material layer 640. The dielectric cap layer 108 includes a dielectric capping material that may protect underlying metal interconnect structures such as the fourth metal line structures 648. In one embodiment, the dielectric cap layer 108 may include a material that may provide high etch resistance, i.e., a dielectric material and also may function as an etch stop material during a subsequent anisotropic etch process that etches the connection-via-level dielectric layer 110. For example, the dielectric cap layer 108 may include silicon carbide or silicon nitride, and may have a thickness in a range from 5 nm to 30 nm, although lesser and greater thicknesses may also be used.

The connection-via-level dielectric layer 110 may include any material that may be used for the dielectric material layers (601, 610, 620, 630, 640). For example, the connection-via-level dielectric layer 110 may include undoped silicate glass or a doped silicate glass deposited by decomposition of tetraethylorthosilicate (TEOS). The thickness of the connection-via-level dielectric layer 110 may be in a range from 50 nm to 200 nm, although lesser and greater thicknesses may also be used. The dielectric cap layer 108 and the connection-via-level dielectric layer 110 may be formed as planar blanket (unpatterned) layers having a respective planar top surface and a respective planar bottom surface that extends throughout the memory array region 100 and the peripheral region 200.

Figure 2:
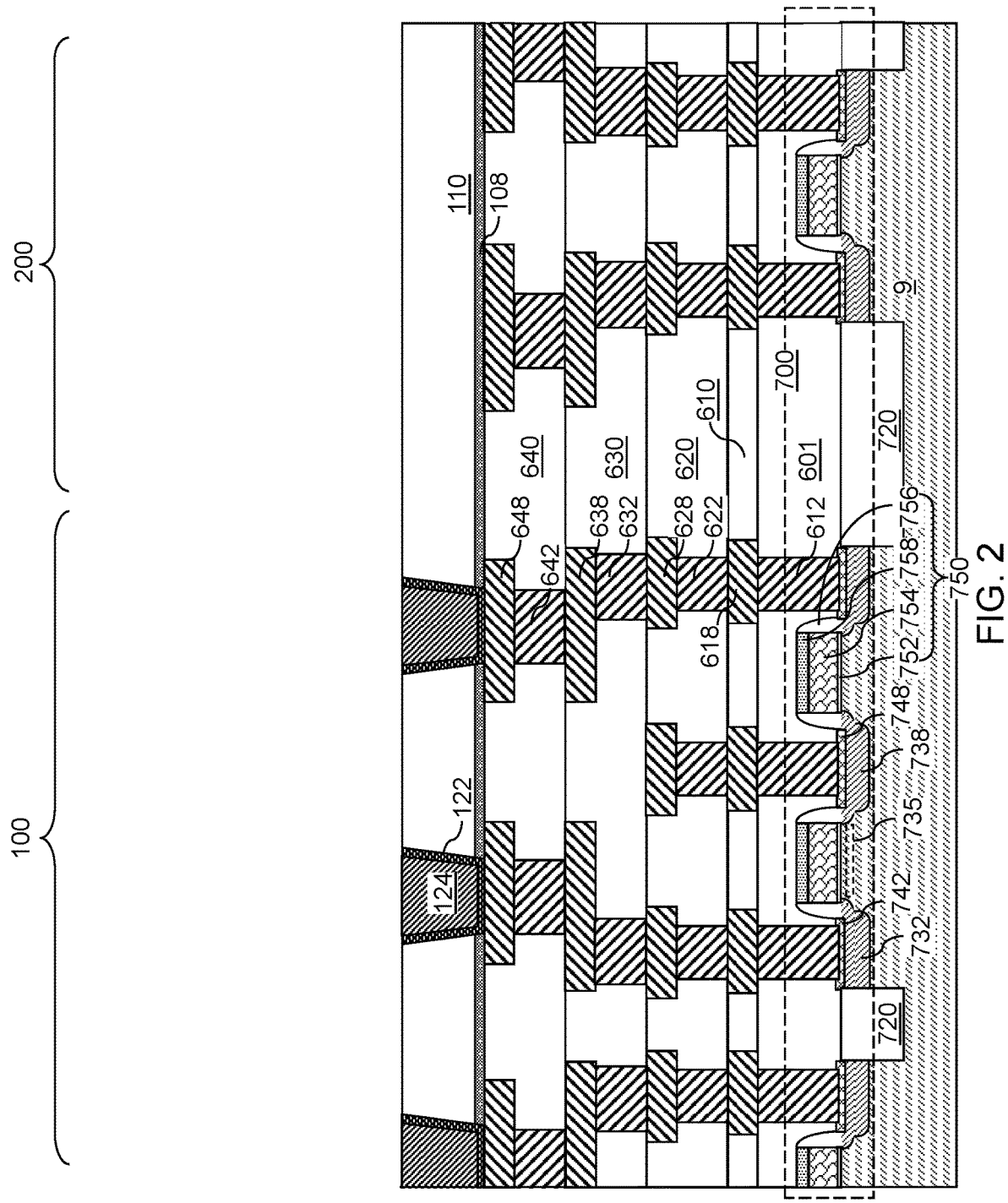
FIG. 2 is a vertical cross-sectional view of the exemplary structure after formation of an array of connection via structures according to an embodiment of the present disclosure.

FIG. 2 is a vertical cross-sectional view of the exemplary structure after formation of an array of connection via structures according to an embodiment of the present disclosure. Via cavities may be formed through the connection-via-level dielectric layer 110 and the dielectric cap layer 108 of the exemplary structure. For example, a photoresist layer (not shown) may be applied over the connection-via-level dielectric layer 110 and may be patterned to form opening within areas of the memory array region 100 that overlie a respective one of the fourth metal line structures 648. An anisotropic etch may be performed to transfer the pattern in the photoresist layer through the through the connection-via-level dielectric layer 110 and the dielectric cap layer 108. The via cavities formed by the anisotropic etch process are herein referred to as lower-electrode-contact via cavities because bottom electrode connection via structures are subsequently formed in the lower-electrode-contact via cavities. The lower-electrode-contact via cavities may have tapered sidewalls having a taper angle (within respective to a vertical direction) in a range from 1 degree to 10 degrees. A top surface of a fourth metal line structure 648 may be physically exposed at the bottom of each lower-electrode-contact via cavity. The photoresist layer may be subsequently removed, for example, by ashing.

A metallic barrier layer may be formed as a material layer. The metallic barrier layer may cover physically exposed top surfaces of the fourth metal line structures 648, tapered sidewalls of the lower-electrode-contact via cavities, and the top surface of the connection-via-level dielectric layer 110 without any hole therethrough. The metallic barrier layer may include a conductive metallic nitride such as TiN, TaN, and/or WN. Other suitable materials within the contemplated scope of disclosure may also be used. The thickness of the metallic barrier layer may be in a range from 3 nm to 20 nm, although lesser and greater thicknesses may also be used.

A metallic fill material such as tungsten or copper may be deposited in remaining volumes of the lower-electrode-contact via cavities. Portions of the metallic fill material and the metallic barrier layer that overlie the horizontal plane including the topmost surface of the connection-via-level dielectric layer 110 may be removed by a planarization process such as chemical mechanical planarization to form. Each remaining portion of the metallic fill material located in a respective via cavity comprises a metallic via fill material portion 124. Each remaining portion of the metallic barrier layer in a respective via cavity comprises a metallic barrier layer 122. Each combination of a metallic barrier layer 122 and a metallic via fill material portion 124 that fills a via cavity constitutes a connection via structure (122, 124). An array of connection via structures (122, 124) may be formed in the connection-via-level dielectric layer 110 on underlying metal interconnect structures. The array of connection via structures (122, 124) may contact top surfaces of a subset of the fourth metal line structures 648. Generally, the array of connection via structures (122, 124) contacts top surfaces of a subset of lower-level metal lines located at the topmost level of the lower-level dielectric layers (601, 610, 620, 630, 640).

Figure 3:
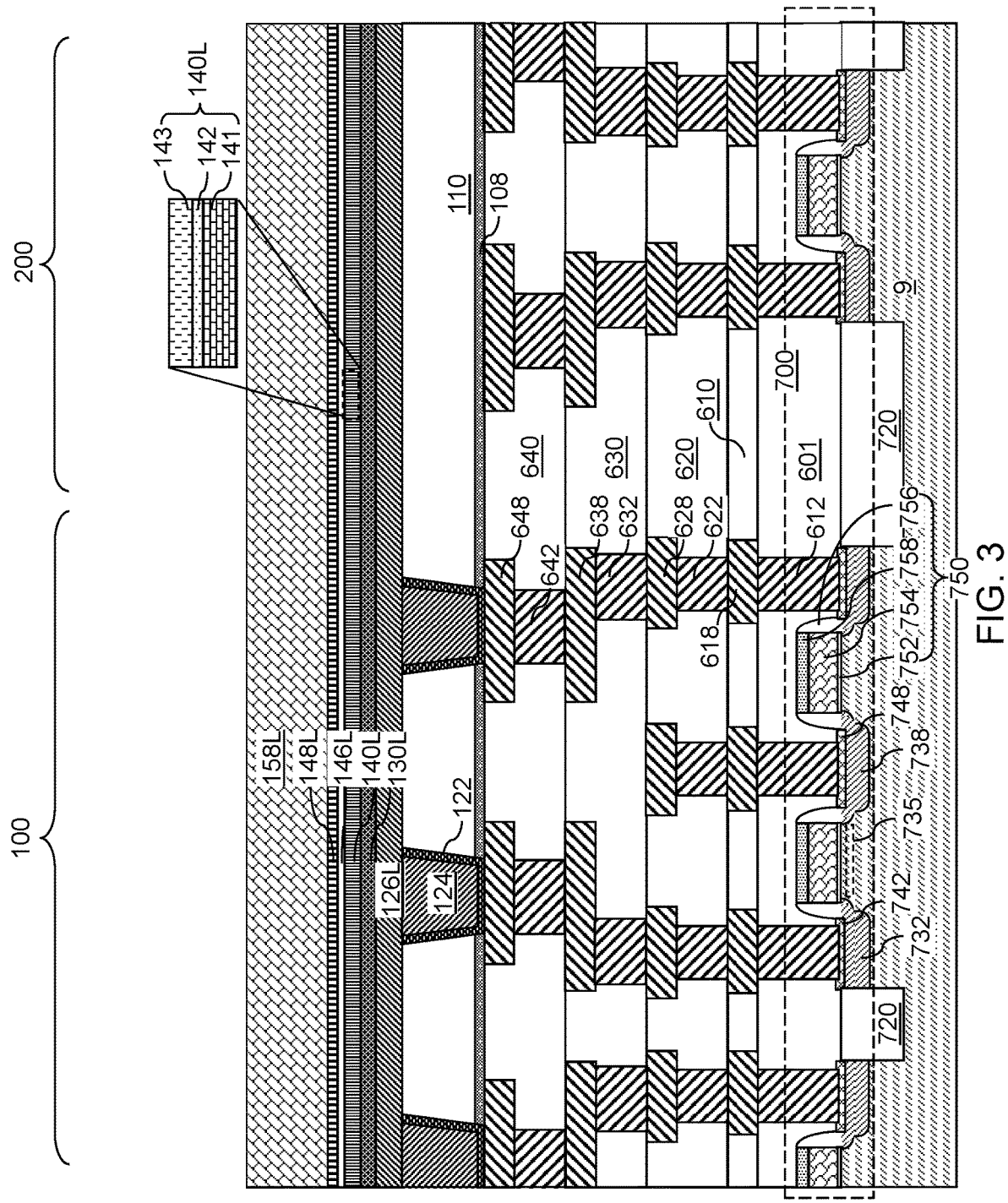
FIG. 3 is a vertical cross-sectional view of the exemplary structure after formation of a bottom electrode material layer, a memory material layer stack, and a top electrode material layer according to an embodiment of the present disclosure.

FIG. 3 is a vertical cross-sectional view of the exemplary structure after formation of a bottom electrode material layer, a memory material layer stack, and a top electrode material layer according to an embodiment of the present disclosure. A bottom electrode material layer 126L, a memory material layer stack (130L, 140L, 146L, 148L), and a top electrode material layer 158L may be formed over the connection-via-level dielectric layer 110 and the array of connection via structures (122, 124) may be formed at the processing steps of FIG. 3.

The bottom electrode material layer 126L includes at least one nonmagnetic metallic material such as TiN, TaN, WN, W, Cu, Al, Ti, Ta, Ru, Mo, Pt, an alloy thereof, and/or a combination thereof. Other suitable materials within the contemplated scope of disclosure may also be used. For example, the bottom electrode material layer 126L may include, and/or may consist essentially of, an elemental metal such as W, Cu, Ti, Ta, Ru, Mo, or Pt. The thickness of the bottom electrode material layer 126L may be in a range from 10 nm to 100 nm, although lesser and greater thicknesses may also be used.

In one embodiment, the memory material layer stack (130L, 140L, 146L, 148L) may include, from bottom to top, an optional nonmagnetic metallic buffer material layer 130L, a synthetic antiferromagnet layer 140L, a nonmagnetic tunnel barrier material layer 146L, and a free magnetization material layer 148L. The layers within the memory material layer stack (130L, 140L, 146L, 148L) may be deposited by a respective chemical vapor deposition process or a respective physical vapor deposition process. Each layer within the memory material layer stack (130L, 140L, 146L, 148L) may be deposited as planar blanket material layers having a respective uniform thickness throughout. Generally, the memory material layer stack (130L, 140L, 146L, 148L) is formed between the bottom electrode material layer 126L and the top electrode material layer 158L.

The nonmagnetic metallic buffer material layer 130L includes a nonmagnetic material that may function as a seed layer. Specifically, the nonmagnetic metallic buffer material layer 130L may provide a template crystalline structure that aligns polycrystalline grains of the materials of the synthetic antiferromagnet layer 140L along directions that maximizes the magnetization of a reference magnetization layer within the synthetic antiferromagnet layer 140L. The nonmagnetic metallic buffer material layer 130L may include Ti, a CoFeB alloy, a NiFe alloy, ruthenium, or a combination thereof. Other suitable materials are within the contemplated scope of disclosure. The thickness of the nonmagnetic metallic buffer material layer 130L may be in a range from 3 nm to 30 nm, although lesser and greater thicknesses may also be used.

The synthetic antiferromagnet (SAF) layer 140L may include a layer stack of a ferromagnetic hard layer 141, an antiferromagnetic coupling layer 142, and a reference magnetization layer 143. Each of the ferromagnetic hard layer 141 and the reference magnetization layer 143 may have a respective fixed magnetization direction. The antiferromagnetic coupling layer 142 provides antiferromagnetic coupling between the magnetization of the ferromagnetic hard layer 141 and the magnetization of the reference magnetization layer 143 so that the magnetization direction of the ferromagnetic hard layer 141 and the magnetization direction of the reference magnetization layer 143 remain fixed during operation of the memory cells to be subsequently formed. The ferromagnetic hard layer 141 may include a hard ferromagnetic material such as PtMn, IrMn, RhMn, FeMn, OsMn, etc. The reference magnetization layer 143 may include a hard ferromagnetic material such as Co, CoFe, CoFeB, CoFeTa, NiFe, CoPt, CoFeNi, etc. Other suitable materials within the contemplated scope of disclosure may also be used. The antiferromagnetic coupling layer 142 may include ruthenium or iridium. The thickness of the antiferromagnetic coupling layer 142 may be selected such that the exchange interaction induced by the antiferromagnetic coupling layer 142 stabilizes the relative magnetization directions of the ferromagnetic hard layer 141 and the reference magnetization layer 143 at opposite directions, i.e., in an antiparallel alignment. In one embodiment, the net magnetization of the SAF layer 140L by matching the magnitude of the magnetization of the ferromagnetic hard layer 141 with the magnitude of the magnetization of the reference magnetization layer 143. The thickness of the SAF layer 140L may be in a range from 5 nm to 30 nm, although lesser and greater thicknesses may also be used.

The nonmagnetic tunnel barrier material layer 146L may include a tunneling barrier material, which may be an electrically insulating material having a thickness that allows electron tunneling. For example, the nonmagnetic tunnel barrier material layer 146L may include magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). Other suitable materials within the contemplated scope of disclosure may also be used. The thickness of the nonmagnetic tunnel barrier material layer 146L may be 0.7 nm to 1.3 nm, although lesser and greater thicknesses may also be used.

The free magnetization material layer 148L includes a ferromagnetic material having two stable magnetization directions that are parallel or antiparallel to the magnetization direction of the reference magnetization layer 143. The free magnetization material layer 148L includes a hard ferromagnetic material such as Co, CoFe, CoFeB, CoFeTa, NiFe, CoPt, CoFeNi, etc. Other suitable materials within the contemplated scope of disclosure may also be used. The thickness of the free magnetization material layer 148L may be in a range from 1 nm to 6 nm, although lesser and greater thicknesses may also be used.

The top electrode material layer 158L includes a top electrode material, which may include any nonmagnetic material that may be used for the bottom electrode material layer 126L. Thus, the top electrode material layer 158L includes a nonmagnetic metallic material containing a nonmagnetic metal element. Exemplary nonmagnetic metallic materials that may be used for the top electrode material layer 158L include, but are not limited to, TiN, TaN, WN, W, Cu, Al, Ti, Ta, Ru, Mo, Pt, an alloy thereof, and/or a combination thereof. Other suitable materials within the contemplated scope of disclosure may also be used. For example, the top electrode material layer 158L may include, and/or may consist essentially of, an elemental metal such as W, Cu, Ti, Ta, Ru, Mo, or Pt. The thickness of the top electrode material layer 158L may be in a range from 8 nm to 80 nm, such as from 16 nm to 40 nm, although lesser and greater thicknesses may also be used. In one embodiment, the top electrode material layer 158L may have a homogenous material composition throughout.

The material layers that are subsequently patterned into magnetic tunnel junction structures are collectively referred to as magnetic tunnel junction material layers (143, 146L, 148L), which include the reference magnetization layer 143, the nonmagnetic tunnel barrier material layer 146L, and the free magnetization material layer 148L. Generally, a layer stack including at least a bottom electrode material layer 126L, magnetic tunnel junction material layers (143, 146L, 148L), and a top electrode material layer 158L may be formed over the substrate 9. The top electrode material layer 158L comprises a metallic material containing a nonmagnetic metal element.

Figure 4:
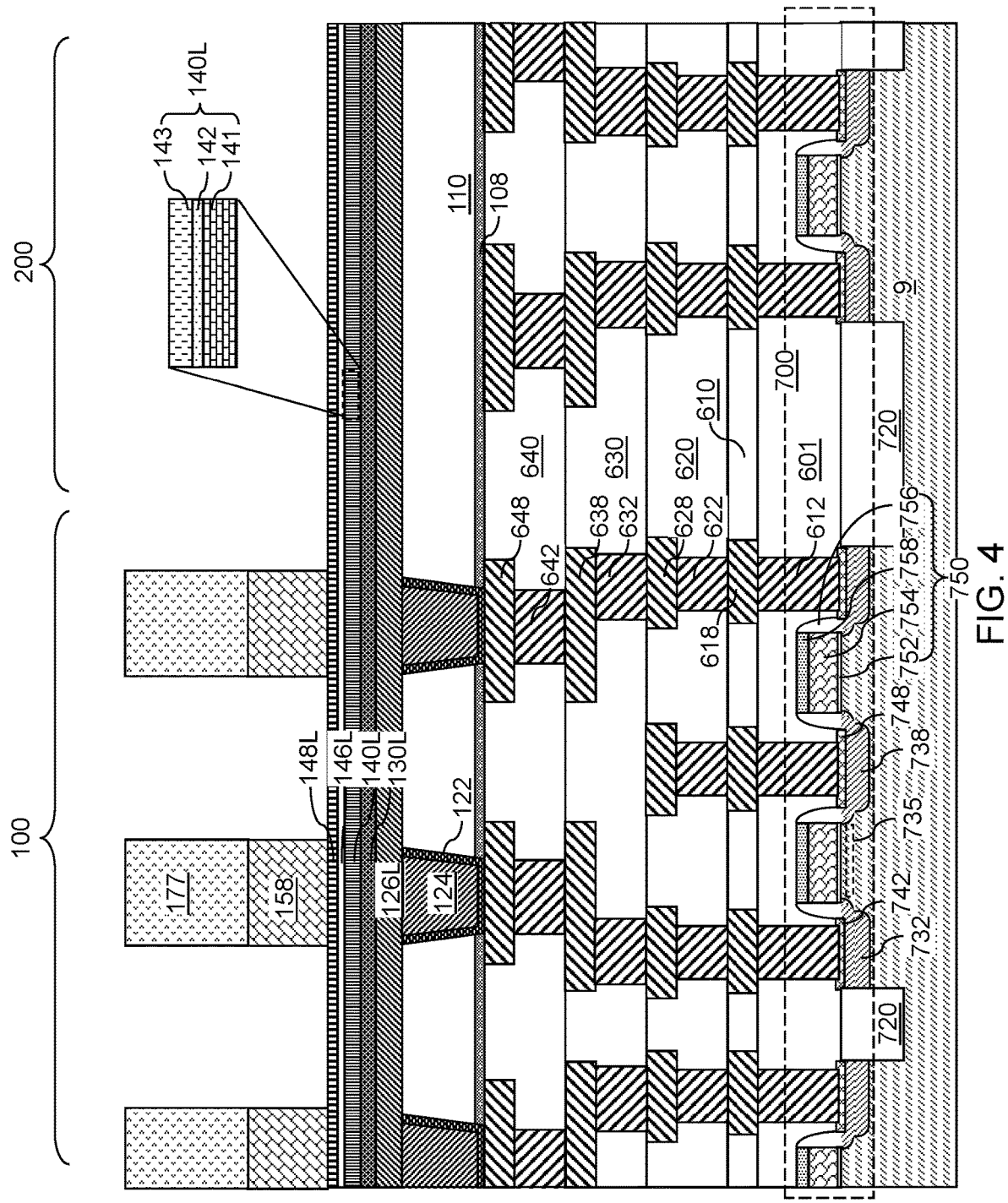
FIG. 4 is a vertical cross-sectional view of the exemplary structure after patterning the top electrode material layer into top electrodes according to an embodiment of the present disclosure.

FIG. 4 is a vertical cross-sectional view of the exemplary structure after patterning the top electrode material layer into top electrodes according to an embodiment of the present disclosure. A photoresist layer 177 may be applied over the top electrode material layer 158L, and may be lithographically patterned into an array discrete photoresist material portions in the memory array region 100. Each patterned portion of the photoresist layer 177 may overlie a respective one of the connection via structures (122, 124). The sidewall(s) of each patterned portion of the photoresist layer 177 may coincide with, may be laterally offset outward from, or may be laterally offset inward from, the periphery of a top surface of an underlying connection via structure (122, 124). The sidewall(s) of each patterned portion of the photoresist layer 177 may have a horizontal cross-sectional shape of a circle, an ellipse, a rectangle, a rounded rectangle, or of any generally curvilinear closed two-dimensional shape.

An anisotropic etch process may be performed to etch unmasked portions of the top electrode material layer 158L. In one embodiment, the topmost layer of the memory material layer stack (130L, 140L, 146L, 148L) may be used as an etch stop layer. Each patterned portion of the top electrode material layer 158L comprises a top electrode 158. A two-dimensional array of top electrodes 158 may be formed by the anisotropic etch process. Each top electrode 158 may be a patterned portion of the top electrode material layer 158L. In one embodiment, the top electrodes 158 comprise, and/or consist essentially of, a conductive metallic nitride material (such as TiN, TaN, or WN), Generally, the top electrode material layer 158L may be patterned into a hard mask structure that includes at least one top electrode 158 such as a two-dimensional array of top electrodes 158. In one embodiment, the two-dimensional array of top electrodes 158 may be formed as a two-dimensional periodic array. In one embodiment, the two-dimensional periodic array of top electrodes 158 may be formed as a rectangular periodic array having a first pitch along a first horizontal direction and having a second pitch along a second horizontal direction that is perpendicular to the first horizontal direction. In one embodiment, the top electrodes 158 may include substantially vertical or tapered sidewalls that vertically extend from a bottom surface to a top surface of a respective top electrode 158. In one embodiment, the taper angle of the sidewalls of the top electrodes 158, as measured from a vertical direction that is perpendicular to interfaces between the top electrodes 158 and the magnetic tunnel junction material layers (143, 146L, 148L), may be in a range from 0 degree to 8 degree, such as from 0.1 degree to 4 degrees, although greater taper angles may also be used. The photoresist layer 177 may be removed after the anisotropic etch process.

Figure 5:
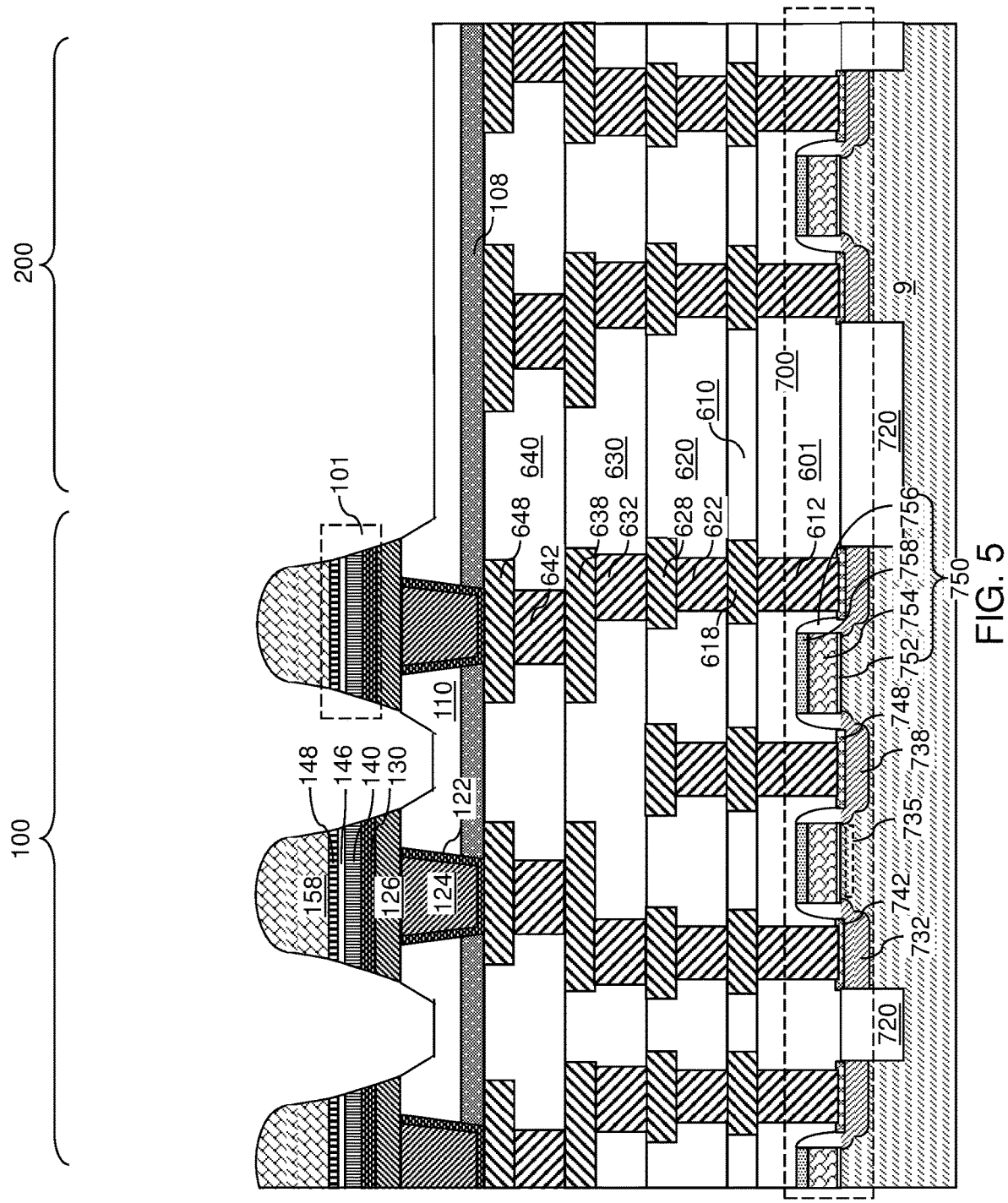
FIG. 5 is a vertical cross-sectional view of the exemplary structure after a focused ion beam etch process that forms an array of memory cells according to an embodiment of the present disclosure.
Figure 6A:
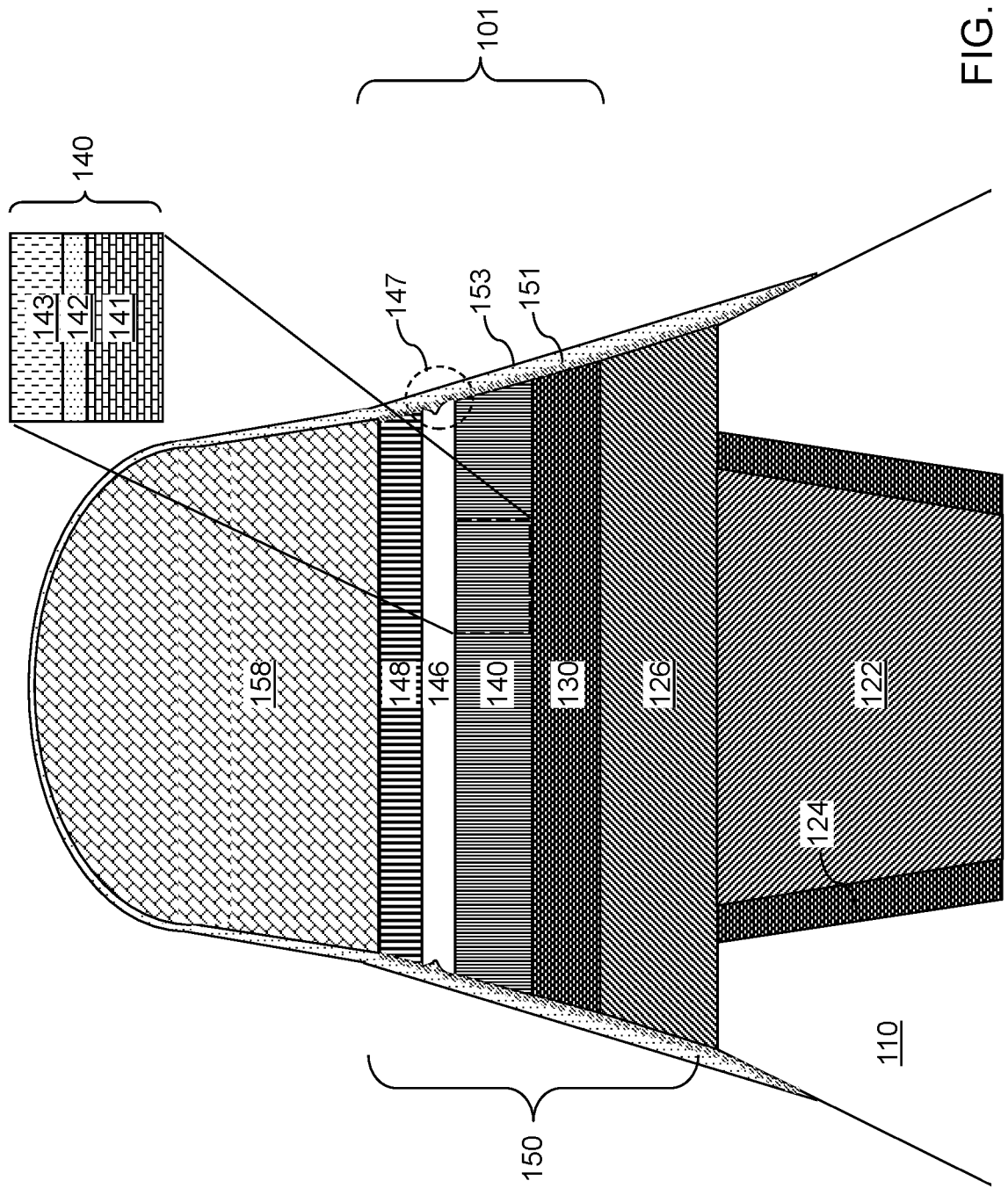

FIG. 5 is a vertical cross-sectional view of the exemplary structure after a focused ion beam etch process that forms an array of memory elements 101 according to an embodiment of the present disclosure. FIG. 6A is a magnified view a region around a memory element 101 of FIG. 5. FIGS. 6A-6E illustrate sequential vertical cross-sectional views of a memory cell during a first exemplary sequence of patterning processes according to an embodiment of the present disclosure.

Referring to FIGS. 5 and 6A, the memory material layer stack (130L, 140L, 146L, 148L) and the bottom electrode material layer 126L may be patterned using a focused ion beam etch process. The array of top electrodes 158 may be used as a hard mask structure for the focused ion beam etch process. The focused ion beam etch process may use a focused beam of ions having energy in a range from 300 eV to 600 eV, although lesser and greater ion energies may also be used. The species of ions that may be used for the focused ion beam etch process include, but are not limited to, gallium, silicon, chromium, iron, cobalt, nickel, germanium, indium, tin, gold, and lead. In one embodiment, the focused ion beam etch process may include ions of a nonmagnetic element such as gallium. The focused ion beam may have a first angular spread in the propagation direction, which may be introduced, for example, by rastering. The first angular spread of the beam angle may be in a range from 0 degree to 30 degrees (as measured from a vertical direction that is perpendicular to the bottom surfaces of the top electrodes 158.

The focused ion beam etch process sequentially etches unmasked portions of the various material layers of the memory material layer stack (130L, 140L, 146L, 148L) and the bottom electrode material layer 126L. The focused ion beam etch process patterns the memory material layer stack (130L, 140L, 146L, 148L) (which include the magnetic tunnel junction material layers (143, 146L, 148L) and the bottom electrode material layer 126L into a patterned structure that includes at least one pillar structure 150. Each pillar structure 150 comprises a bottom electrode 126 and a memory element 101. Each memory element 101 includes a magnetic tunnel junction structure (141, 146, 148) therein. In one embodiment, a two-dimensional array of top electrodes 158 may be used as an etch mask throughout the focused ion beam etch process. In this embodiment, portions of the memory material layer stack (130L, 140L, 146L, 148L) and the bottom electrode material layer 126L that are not masked by the two-dimensional array of top electrodes 158 may be etched by the focused ion beam etch process. The patterned structure may include a two-dimensional array of pillar structures 150.

A combination of a top electrode 158 and a pillar structure 150 constitutes a memory cell (158, 150). Thus, each memory cell (158, 150) includes a vertical stack including a top electrode 158, a memory element 101, and a bottom electrode 126. In one embodiment, each memory cell (158, 150) may be a magnetic tunnel junction (MTJ) memory cell. Each MTJ memory cell may include a bottom electrode 126, a magnetic tunnel junction structure (140, 146, 148), and a top electrode 158. Each memory element 101 comprises a vertical stack including a synthetic antiferromagnet structure 140, a tunnel barrier layer 146, and a free magnetization layer 148. Each memory element 101 may include an optional nonmagnetic metallic buffer layer and a magnetic tunnel junction structure (140, 146, 148).

Each magnetic tunnel junction structure (140, 146, 148) may include a reference magnetization layer 143 (which may be a component of a synthetic antiferromagnet (SAF) structure 140), a tunnel barrier layer 146, and a free magnetization layer 148. Generally, the ferromagnetic hard layer 141 and the antiferromagnetic coupling layer 142 in an SAF structure may be omitted, or may be replaced with another magnetic structure that stabilizes the direction of magnetization in the reference magnetization layer 143. A nonmagnetic metallic buffer layer 130 may be provided between the bottom electrode 126 and the magnetic tunnel junction structure (140, 146, 148). Each bottom electrode 126 is a patterned portion of the bottom electrode material layer 126L. Each SAF structure 140 may be a patterned portion of the SAF layer 140L. Each tunnel barrier layer 146 may be a patterned portion of the nonmagnetic tunnel barrier material layer 146L. Each free magnetization layer 148 may be a patterned portion of the free magnetization material layer 148L. The synthetic antiferromagnetic structure 140 may include a layer stack of a ferromagnetic hard layer 141, an antiferromagnetic coupling layer 142, and a reference magnetization layer 143. Generally, in embodiments in which each memory element 101 comprises a magnetic tunnel junction memory element, each memory element 101 may comprise a reference magnetization layer 143, a tunnel barrier layer 146 in contact with the reference magnetization layer 143, and a free magnetization layer 148 in contact with the tunnel barrier layer 146. Generally, the reference magnetization layer 143 includes a first ferromagnetic material, and the free magnetization layer 148 includes a second ferromagnetic material, which may be the same as, or may be different from, the first ferromagnetic material.

The pillar structures 150 may be tapered pillar structures having a respective tapered sidewall. The tapered pillar structures may include sidewalls having a non-zero average taper angle, i.e., having a non-vertical surface. An "average" angle refers to an angle as measured over all relevant surfaces. Thus, an average angle of a tapered surface having different local taper angles may be calculated by averaging the local taper angles. The average taper angle of the pillar structures 150 may vary from layer to layer, and generally may be in a range from 2 degrees to 12 degrees, such as from 3 degrees to 10 degrees, although lesser and greater average taper angles may also be used. Generally, the average taper angle of sidewalls of lower portions of the top electrodes 158 may be the same as the average taper angle of the pillar structures 150, or may be less than the average taper angle of the pillar structures 150 at this processing step.

Unmasked portions of the connection-via-level dielectric layer 110 may be vertically recessed by the focused ion beam etch process. In an alternative embodiment, an ion milling process may be used in lieu of the focused ion beam etch process. The array of connection via structures (122, 124) may be located underneath the array of memory cells (158, 150), and may contact a bottom surface of a respective one of the bottom electrodes 126. This ion beam etch process forms shallow recess in the connection-via-level dielectric layer 110 between the pillar structures 150. This feature provides the benefit of providing a tapered hard mask profile and a shallow recess depth, and applies magnetized inductively coupled plasma (MCP) for cleaning and/or oxidation of metallic ions. According to of the present disclosure, a depth of the shallow recess is no more than 300 angstroms, shallower than a conventional recess.

The connection-via-level dielectric layer 110 underlies the array of pillar structures 150. Portions of the connection-via-level dielectric layer 110 that are not covered by the two-dimensional array of memory cells (158, 150) may be vertically recessed below the horizontal plane including the interfaces between the array of connection via structures (122, 124) and the array of memory cells (158, 150). The remaining portions of the connection-via-level dielectric layer 110 may include a recessed horizontal top surface that is adjoined to bottom peripheries of tapered sidewalls of portions of the connection-via-level dielectric layer 110 that underlie the array of memory cells (158, 150). As such, the connection-via-level dielectric layer 110 comprises an array of mesa portions protruding upward from a planar portion of the connection-via-level dielectric layer 110. The array of mesa portions of the connection-via-level dielectric layer 110 contacts the array of pillar structures 150. In one embodiment, each mesa portion of the connection-via-level dielectric layer 110 may contact an annular portion of a bottom surface of a respective pillar structure 150. Each mesa portion of the connection-via-level dielectric layer 110 may have a tapered sidewall adjoined to a tapered sidewall of a pillar structure 150, which is herein referred to as a tapered pillar sidewall.

Generally, a top electrode 158 overlies a magnetic tunnel junction structure (143, 146, 148) in each memory cell (158, 150). The top electrodes 158 comprise a metallic material containing a nonmagnetic metal element. A connection via structure (122, 124) may be embedded within each mesa portion of the connection-via-level dielectric layer 110, and may contact a center portion of the bottom surface of the pillar structure 150.

Generally, the focused ion beam etch process forms a residual metal film 151 on physically exposed sidewalls of the pillar structure 150 and in upper portions of the tapered sidewalls of the mesa portions of the connection-via-level dielectric layer 110. The residual metal film 151 includes metallic particles dislodged from the top electrodes 158 and the metallic material layers within the memory material layer stack (130L, 140L, 146L, 148L) and the bottom electrode material layer 126L during the focused ion beam etch process. While a predominant portion of metallic particles that are dislodged from the top electrodes 158 and the metallic material layers within the memory material layer stack (130L, 140L, 146L, 148L) during the focused ion beam etch process are removed from the sidewalls of the top electrodes 158 and the pillar structures 150, the scatter directions of the dislodged metallic particles are statistically random. A fraction of the dislodged metallic particles may be deposited on the physically exposed sidewalls of the top electrodes 158 and the pillar structures 150. The thickness of the residual metallic film 151 may be in a range from 0.2 nm to 2 nm, such as from 0.4 nm to 1.2 nm, although the residual metallic film 151 may have a lesser thickness or a greater thickness. The residual metallic film 151 may be a continuous layer without openings therethrough, or may have discrete openings therethrough, or may be formed as discrete islands that are not connected to one another depending on the thickness.

Further, a residual byproduct layer 153 including a compound of ion beam species of the focus ion beam etch process may be formed on the surfaces of the top electrodes 158 and on the sidewalls of the pillar structures 150. For example, if the focused ion beam etch process uses an ion beam of gallium, the residual byproduct layer 153 may include atoms, compounds, and/or alloys of gallium. In one embodiment, the residual byproduct layer 153 may include compounds and/or alloys of the ion beam species of the focus ion beam etch process with materials of adjacent material portions within the pillar structure 150 or with the material of the top electrode 158. The residual byproduct layer 153 may be interlaced with, or located on, the residual metal film 151. The thickness of the residual byproduct layer 153 may be in a range from 1 nm to 4 nm, such as from 2 nm to 3 nm, although lesser and greater thicknesses are possible depending on the energy, ion beam species, and the incidence of the ions during the focused ion beam etch process. Generally, surface portions of the top electrodes 158 are etched during the focused ion beam etch process, and thus, the top electrodes 158 are a significant source of metallic materials for the residual metal film 151. As a consequence, the residual metal film 151 on a sidewall of each pillar structure 150 contains the nonmagnetic metal element of the top electrodes 158.

In one embodiment, the focused ion beam etch process may etch the material of the tunnel barrier layer 146 (which may be a non-metallic material) at a higher etch rate than the metallic materials of the metallic material layers within the memory material layer stack (130L, 140L, 146L, 148L). In this embodiment, an annular lateral recess 147 that azimuthally extends around the entire sidewall of the tunnel barrier layer 146 may be formed within each pillar structure 150. The vertical cross-sectional profile of such an annular lateral recess 147 may have a shape that is similar to a vertical cross-sectional shape of a bird's beak, which is herein referred to as a bird's beak profile. In this embodiment, each tunnel barrier layer 146 may have a bird's beak profile in a vertical cross-sectional view in which a portion of a sidewall of the tunnel barrier layer 146 is laterally recessed inward to provide the annular lateral recess 147, which is a continuous lateral recess that extends around the sidewall of the tunnel barrier layer 146. The depth of the annular lateral recess (as measured along a radial direction) may be in a range from 1 nm to 4 nm, although lesser and greater depths are possible. The height of the annular lateral recess may be on the order of the thickness of the tunnel barrier layer 146.

Figure 6B:
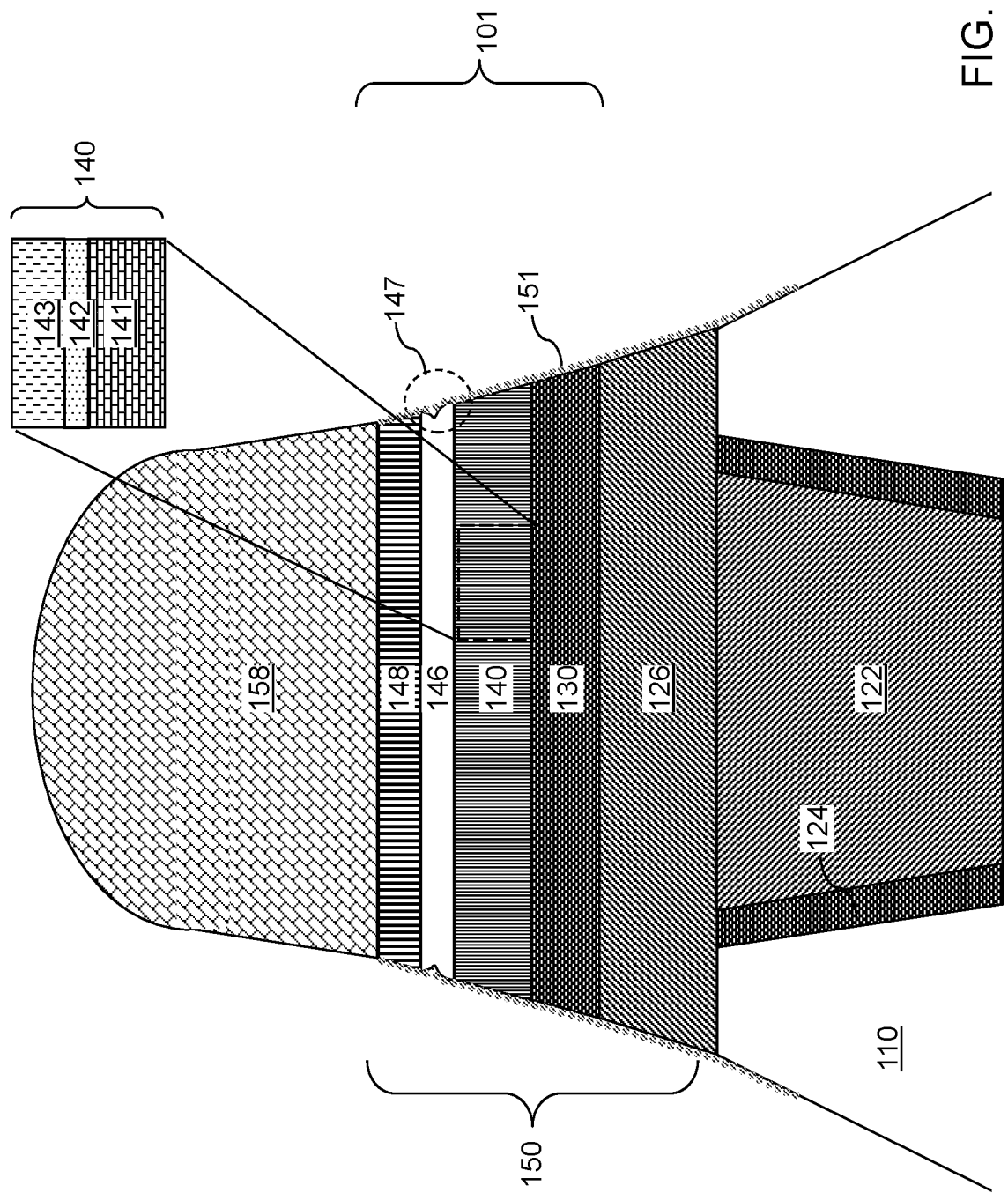

Referring to FIG. 6B and according to an aspect of the present disclosure, a predominant portion (i.e., more than 50% in volume) of the residual byproduct layer 153 may be removed by performing an angled ion beam bombardment process. The angled ion beam bombardment process is optional, but is preferable. During the angled ion beam bombardment process, ions in a focused ion beam impinge on the residual byproduct layer 153 at an angle that is greater than 30 degrees relative to a vertical direction. The vertical direction refers to the direction that is perpendicular to the interfaces between the pillar structures 150 and the top electrodes 158.

The process parameters of a focused ion beam during the angled ion beam bombardment process may be selected to increase the fraction of the material of the residual byproduct layer 153. For example, the incidence angle of the ion beam (as measured as a deviation angle from a vertical direction) of the angled ion beam bombardment process may be in a range from 30 degrees to 90 degrees, and the energy of the ions in the ion beam of the angled ion beam bombardment process may be in a range from 50 eV to 200 eV, although lesser and greater energies may also be used. Generally, the incidence angle of the ion beam of the angled ion beam bombardment process is greater than the incidence angle of the ion beam of the focused ion beam etch process. The energy of the ion beam of the angled ion beam bombardment process is less than the energy of the ion beam of the focused ion beam etch process. The volume fraction of the portion of the residual byproduct layer 153 that is removed during the angled ion beam bombardment process may be in a range from 0.5 to 0.99, such as from 0.6 to 0.9, although lesser and greater volume fractions may also be used depending on the process parameters. Generally, the predominant portion of the residual metal film 151 tends to remain on the sidewalls of the pillar structures 150 and on the surfaces of the top electrodes 158 and on sidewalls of the mesa portions of the connection-via-level dielectric layer 110.

Referring to FIG. 6C and according to an aspect of the present disclosure, a recess reduction ion beam etch process may be performed. The recess reduction ion beam etch process is optional, but is preferable. Ions having a lower energy than ion energy during the focused ion beam etch process are directed to the pillar structures 150 and the top electrodes 158, and removes the metallic materials within the magnetic tunnel junction structures (143, 146, 148) at a greater etch rate than the material of the tunnel barrier layer 146. In other words, the recess reduction ion beam etch process removes the first ferromagnetic material of the reference magnetization layer 143 and the second ferromagnetic material of the free magnetization layer 148 at a greater etch rate than the material of the tunnel barrier layer 146.

The process parameters of a focused ion beam during the recess reduction ion beam etch process may be selected to reduce the recess depth of the annular lateral recess 147 of each pillar structure 150. For example, the incidence angle of the ion beam (as measured as a deviation angle from a vertical direction) of the recess reduction ion beam etch process may be in a range from 0 degree to 30 degrees, and the energy of the ions in the ion beam of the recess reduction ion beam etch process may be in a range from 50 eV to 200 eV, although lesser and greater energies may also be used. Generally, the incidence angle of the ion beam of the recess reduction ion beam etch process may be the same as the incidence angle of the ion beam of the focused ion beam etch process, and the energy of the ion beam of the recess reduction ion beam etch process is less than the energy of the ion beam of the focused ion beam etch process. Generally, the predominant portion of the residual metal film 151 tends to remain on the sidewalls of the pillar structures 150 and on the surfaces of the top electrodes 158 and on sidewalls of the mesa portions of the connection-via-level dielectric layer 110. The depth of the annular lateral recess 147 may decrease by a percentage in a range from 5% to 50%, such as from 10% to 30%, although lesser and greater percentages may also be used.

Figure 6D:
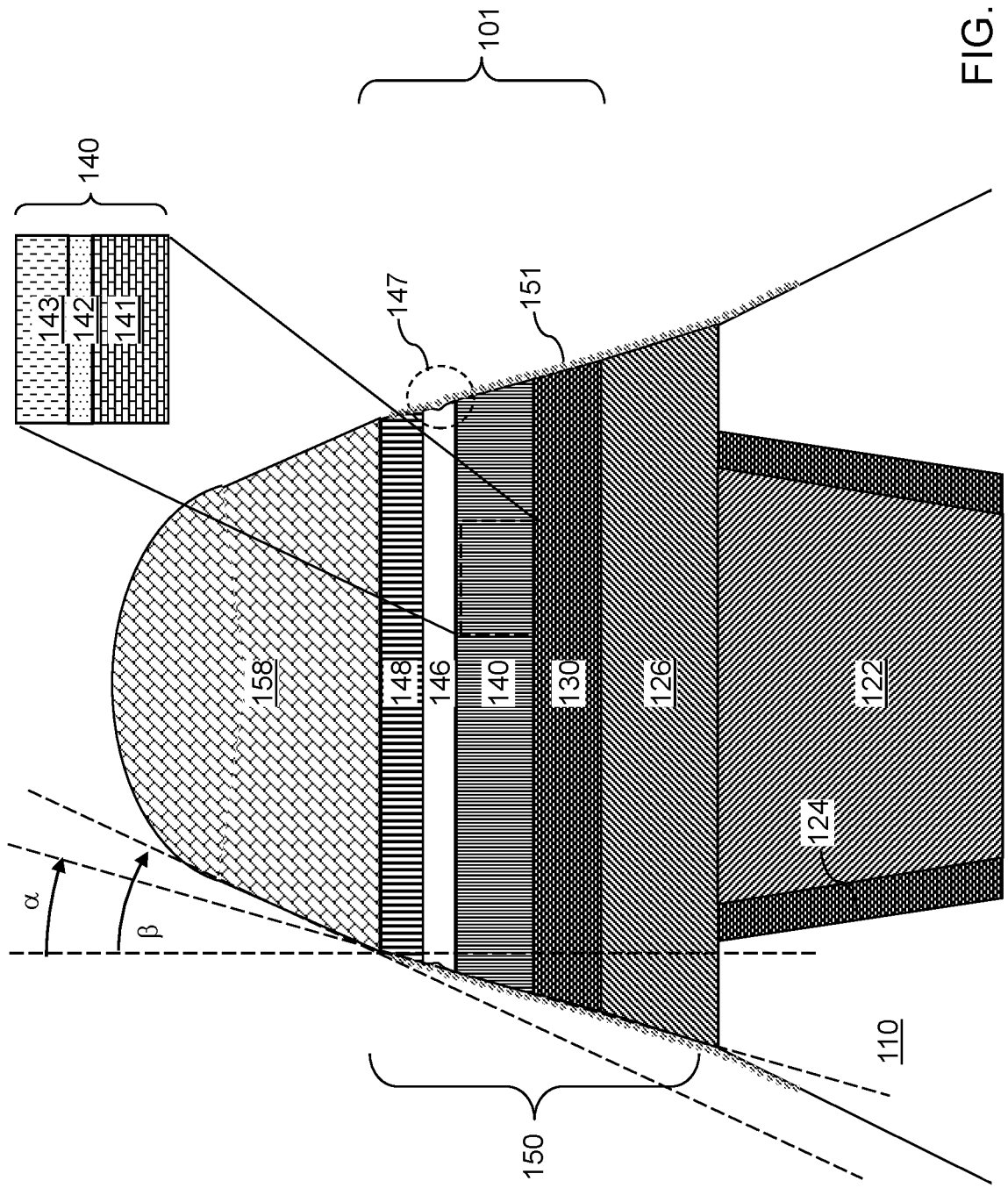

Referring to FIG. 6D and according to an aspect of the present disclosure, a hard mask trim ion beam etch process may be performed. The hard mask trim ion beam etch process is an optional process, but is a preferred process. An ion beam having a second angular spread may be directed to the pillar structure 150 and the top electrodes 158. The second angular spread of the ion beam of the hard mask trim ion beam etch process may be less than the first angular spread of the ion beam of the focused ion beam etch process used at the processing steps of FIGS. 5 and 6A. Thus, a higher percentage of ions impinge on the top electrodes 158 than on the sidewalls of the pillar structures 150 during the hard mask trim ion beam etch process compared to the focused ion beam etch process. The top electrodes 158 are etched to provide a sidewall having a greater taper angle with respect to the vertical direction.

The process parameters of a focused ion beam during the hard mask trim ion beam etch process may be selected to increase the average taper angle of the sidewalls of the top electrodes 158. For example, the incidence angle of the ion beam (as measured as a deviation angle from a vertical direction) of the hard mask trim ion beam etch process may be in a range from 0 degree to 20 degrees such as from 0 degree to 10 degrees, and the energy of the ions in the ion beam of the recess reduction ion beam etch process may be in a range from 300 eV to 600 eV, although lesser and greater energies may also be used. Generally, the incidence angle of the ion beam of the hard mask trim ion beam etch process is less than the incidence angle of the ion beam of the focused ion beam etch process by at least 5 degrees and/or by 10 degrees, and the energy of the ion beam of the recess reduction ion beam etch process may be about the same as the energy of the ion beam of the focused ion beam etch process.

Each top electrode 158 may have a tapered sidewall and a convex top surface. Generally, the convex top surface adjoins the tapered sidewall at an angle such that an annular boundary between the convex top surface and the tapered sidewall may be well defined. The tapered sidewalls of the top electrodes 158 are herein referred to as tapered electrode sidewalls. The tapered sidewalls of the pillar structures 150 are herein referred to as tapered pillar sidewalls. The average taper angle of the tapered sidewalls of the pillar structures 150 (i.e., the tapered pillar sidewalls) is herein referred to as a first average taper angle $\alpha$. The average taper angle of the tapered sidewalls of the top electrodes 158 (i.e., the tapered electrode sidewalls) is herein referred to as a second average taper angle $\beta$. The first average taper angle $\alpha$ does not substantially change during the hard mask trim ion beam etch process. However, the second average taper angle $\beta$ increases at least by 0.5 degree during the hard mask trim ion beam etch process. Typically, the second average taper angle $\beta$ is the same as the first average taper angle a prior to the hard mask trim ion beam etch process. The increase in the second average taper angle $\beta$ during the hard mask trim ion beam etch process may be in a range from 0.5 degree to 20 degree, such as from 3 degrees to 15 degrees. For example, the first average taper angle $\alpha$ after the hard mask trim ion beam etch process may be in a range from 8 degrees to 32 degrees, and the second average taper angle $\beta$ after the hard mask trim ion beam etch process may be in a range from 2 degrees to 12 degrees.

Within each memory cell (158, 150), a top electrode 158 overlying a magnetic tunnel junction structure (143, 146, 148) includes a tapered electrode sidewall adjoining a pillar structure 150 and having the first average taper angle $\alpha$ with respect to the vertical direction (which is perpendicular to an interface with the pillar structure 150) after the hard mask trim ion beam etch process. The pillar structure 150 may have has a tapered pillar sidewall extending from the top surface of the pillar structure 150 to the bottom surface of the pillar structure 150, and the tapered pillar sidewall may have the second average taper angle $\beta$ with respect to the vertical direction that is less than the first average taper angle $\alpha$. The top periphery of the tapered pillar sidewall may coincide with the bottom periphery of the tapered electrode sidewall of the top electrode 158. The increase in the second average taper angle $\beta$ has the advantageous effect of increasing the supply of oxygen source gas to the sidewalls of the pillar structures 150 during a subsequent plasma oxidation process, and of increasing the effectiveness of the subsequent plasma oxidation process.

Figure 7:
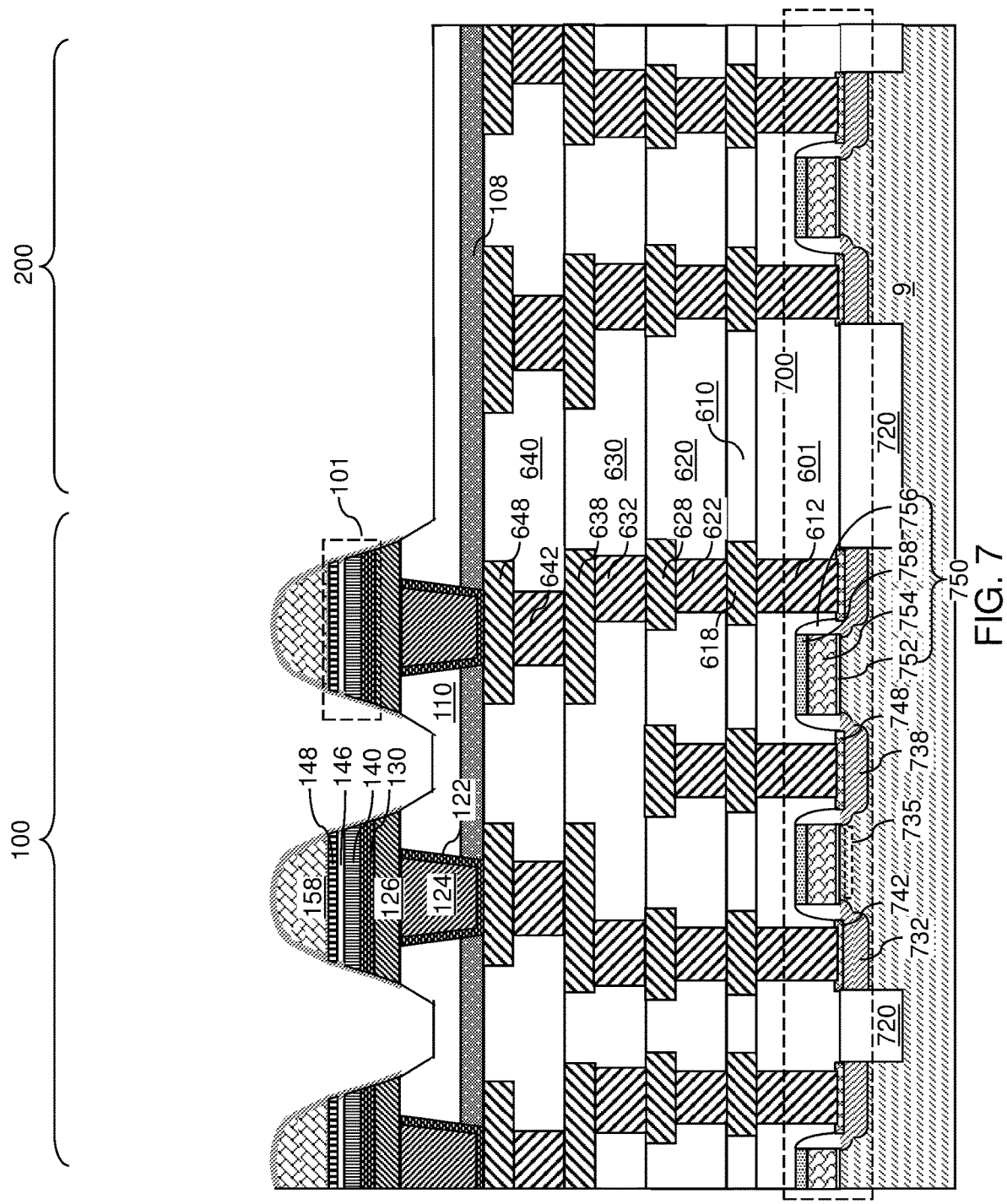
FIG. 7 is a vertical cross-sectional view of the exemplary structure after the patterning process of FIG. 6E according to an embodiment of the present disclosure.

FIG. 6E is a vertical cross-sectional view of a memory cell 150 after an oxidation process that forms a dielectric metal oxide layer 154. FIG. 7 is a vertical cross-sectional view of the exemplary structure after the patterning process of FIG. 6E according to an embodiment of the present disclosure.

Referring to FIGS. 6E and 7, an oxidation process may be performed to convert the residual metal film 151, surface portions of the top electrodes 158, and surface portions of the metallic materials within the pillar structures 150 into a dielectric metal oxide layer 154. The surface portions of the metallic materials within the pillar structures 150 include surface portions of metallic materials within the magnetic tunnel junction structures (143, 146, 148), i.e., the surface portions of the first ferromagnetic material of the reference magnetization layers 143 and the surface portions of the second ferromagnetic material of the free magnetization layers 148. Each dielectric metal oxide layer 154 may be formed on a respective memory cell (158, 150), and may include an upper portion in contact with a top electrode 158, a lower portion in contact with the tapered pillar sidewall (i.e., the sidewall of the pillar structure 150), and a bottom portion in contact with tapered surfaces of a mesa portion of the connection-via-level dielectric layer 110.

Due to the various metal interconnect structures that are present in the dielectric material layers in the exemplary structure, the maximum temperate that the exemplary structure may be subjected to during back-end-of-line processing steps is about 400 degrees Celsius. Thus, a thermal oxidation process is impractical. According to an aspect of the present disclosure, the oxidation process used at this processing step comprises a plasma oxidation process. In one embodiment, methanol in a gas phase may be used as an oxygen source gas during the plasma oxidation process. To increase the effectiveness of the plasma oxidation process, a magnetized inductively coupled plasma (MICP) oxidation process may be used. While the MICP oxidation process provides effective oxidation at a low processing temperature, the effectiveness and the process uniformity may be compromised in instances where the supply of the oxygen source gas to recessed regions is limited during the MICP oxidation process. The hard mask trim ion beam etch process at the processing steps of FIG. 6D has the effect of reducing the aspect ratio of recessed regions (i.e., regions proximal to the recessed horizontal surface of the connection-via-level dielectric layer 110) in the two-dimensional array of memory cells (158, 150). Thus, the hard mask trim ion beam etch process increases the process uniformity and the effectiveness of the MICP oxidation process.

Around each memory cell (158, 150), the metallic materials that are incorporated into the dielectric meal oxide layer 154 have a compositional variation across the various surfaces of the top electrode 158, the pillar structure 150, and the mesa portion of the connection-via-level dielectric layer 110. As such, each dielectric meal oxide layer 154 may have a compositional variation therein.

Each dielectric metal oxide layer 154 extends over a tapered electrode sidewall and a tapered pillar sidewall of a memory cell (158, 150). The material of the upper portion of each dielectric metal oxide layer 154 contacting a top electrode 158 may be primarily derived from oxidation of the nonmagnetic metal element of the top electrode 158. Thus, the upper portion of the dielectric metal oxide layer 154 may comprise the metal oxide of the nonmagnetic metal element of the top electrode 158 at an average molar fraction in a range from 0.9 to 1.0.

Each magnetic tunnel junction structure (143, 146, 148) may contain a reference magnetization layer 143 including a first ferromagnetic material, a tunnel barrier layer 146, and a free magnetization layer 148 including a second ferromagnetic material. In this embodiment, a lower portion of each dielectric metal oxide layer 154 may be formed on a tapered sidewall of a respective pillar structure 150, and may comprise a composite dielectric metal oxide material containing a metal oxide of the first ferromagnetic material, a metal oxide of the second ferromagnetic material, and a metal oxide of the nonmagnetic metal element. The atomic percentage of the nonmagnetic metal element of the top electrodes 158 within the residual metallic film 151 may vary depending on the processing sequence and on the process parameters, and may be in a range from 0.001 to 0.5, such as from 0.01 to 0.3 and/or from 0.1 to 0.2. The average molar fraction of the metal oxide of the nonmagnetic metal element within the lower portion of the dielectric metal oxide layer 154 may be in a range from 0.001 to 0.5, such as from 0.01 to 0.3 and/or from 0.1 to 0.2, although lower and higher molar percentages may be possible depending on process parameters.

In one embodiment, the lower portion of each dielectric metal oxide layer 154 in contact with a tapered pillar sidewall may have a compositional modulation along a vertical direction. For example, within each residual metallic film 151, the first ferromagnetic material may have a higher atomic percentage on a sidewall of the reference magnetization layer 143, the second ferromagnetic material may have a higher atomic percentage on a sidewall of the free magnetization layer 148, and the nonmagnetic metal element of the top electrodes 158 may have a higher atomic percentage on a sidewall of tunnel barrier layer 146. Generally, the atomic percentage of the nonmagnetic metal element of the top electrodes 158 within the residual metallic film 151 may vary depending on the processing sequence and on the process parameters. In one embodiment, a peak in the molar fraction of the metal oxide of the nonmagnetic metal element within the lower portion of the dielectric metal oxide layer 154 may be located adjacent to the tunnel barrier layer 146, for example, between a horizontal plane including a top surface of the tunnel barrier layer 146 and a horizontal plane including a bottom surface of the tunnel barrier layer 146.

In one embodiment, a bottom portion of each dielectric metal oxide layer 154 extends over an upper portion of a tapered sidewall of a respective underlying mesa portion of the connection-via-level dielectric layer 110, The bottom portion of the dielectric metal oxide layer 154 may comprise the metal oxide of the nonmagnetic metal element at an average molar fraction in a range from 0.2 to 1.0, such as from 0.3 to 0.8 and/or from 0.4 to 0.6, although lesser and greater average molar fractions are also possible.

Within a pillar structure 150, the tunnel barrier layer 146 in each pillar structure 150 may have a bird's beak profile in a vertical cross-sectional view in which a portion of a sidewall of the tunnel barrier layer 146 is laterally recessed inward to provide an annular lateral recess 147. The dielectric metal oxide layer 154 at least partially fills, and/or completely fills, the annular lateral recess 147 such that an outer sidewall of the dielectric metal oxide layer 154 has a lesser lateral undulation over the tunnel barrier layer 146 in a vertical cross-sectional profile than an inner sidewall of the dielectric metal oxide layer 154 that contacts the tunnel barrier layer 146 has in the vertical cross-sectional profile.

The thickness of the dielectric metal oxide layer 154 may vary across the various material portions of a memory cell (158, 150) due to the variations in the material composition of the residual metallic film 151, due to the thickness variation in the residual metallic film 151, and due to the differences in the composition of underlying material portions and resulting differences in the oxidation rate of the underlying material portions of the memory cell (158, 150). Further, the duration of the plasma oxidation process used to form the dielectric metal oxide layer 154 affects the thickness of the dielectric metal oxide layer 154. Generally, the thickness of the dielectric metal oxide layer 154 may be in a range from 0.5 nm to 6 nm, such as from 1 nm to 3 nm, although lesser and greater thicknesses may also be used. Generally, the dielectric metal oxide layer 154 may be formed as a continuous material layer, and not as discrete patches of disjoined material portions. By forming the dielectric metal oxide layer 154 as a continuous material layer, electrically conductive paths on the tapered pillar sidewalls of the pillar structures 150 may be removed.

Figure 8:
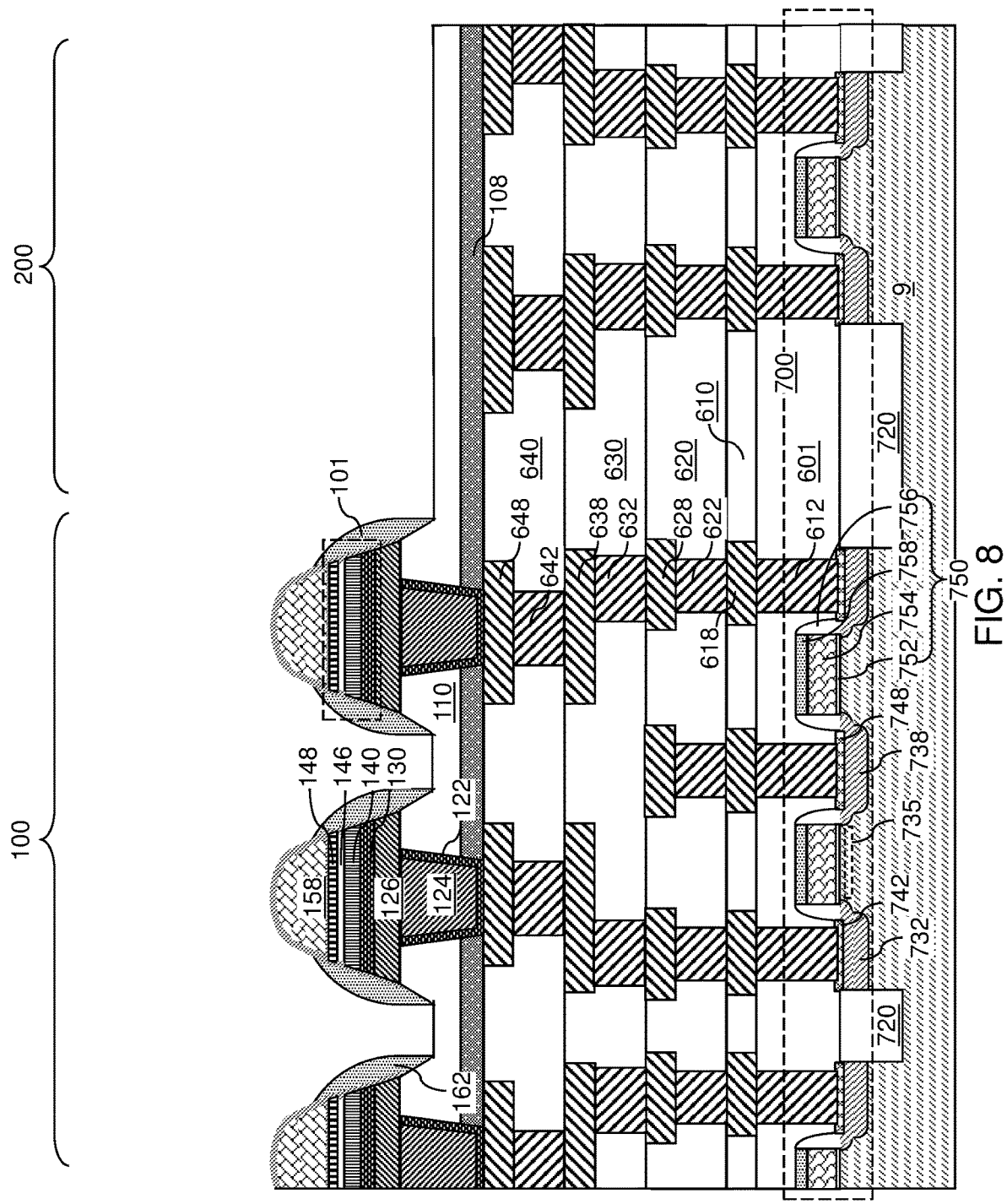
FIG. 8 is a vertical cross-sectional view of the exemplary structure after formation of an array of dielectric spacers according to an embodiment of the present disclosure.

FIG. 8 is a vertical cross-sectional view of the exemplary structure after formation of an array of dielectric spacers 162 according to an embodiment of the present disclosure. A dielectric spacer material may be conformally deposited over the array of memory cells (158, 150). In one embodiment, the dielectric spacers 162 may include a diffusion barrier dielectric material such as silicon nitride. The dielectric spacer material may be deposited by a plasma-enhanced chemical vapor deposition process. The thickness of the dielectric spacer material may be in a range from 2 nm to 20 nm, such as from 4 nm to 10 nm, although lesser and greater thicknesses may also be used. An anisotropic etch process may be performed to remove horizontal portions of the dielectric spacer. Remaining portions of the dielectric spacer material comprise an array of dielectric spacers 162 that laterally surrounds the array of memory cells (158, 150). In one embodiment, the duration of the anisotropic etch process may be selected such that dielectric metal oxide layers 154 are physically exposed above a top portion of each top electrode 158. The maximum thickness of each dielectric spacer 162 may be in a range from 2 nm to 20 nm, such as from 4 nm to 10 nm, although lesser and greater thicknesses may also be used.

Figure 9:
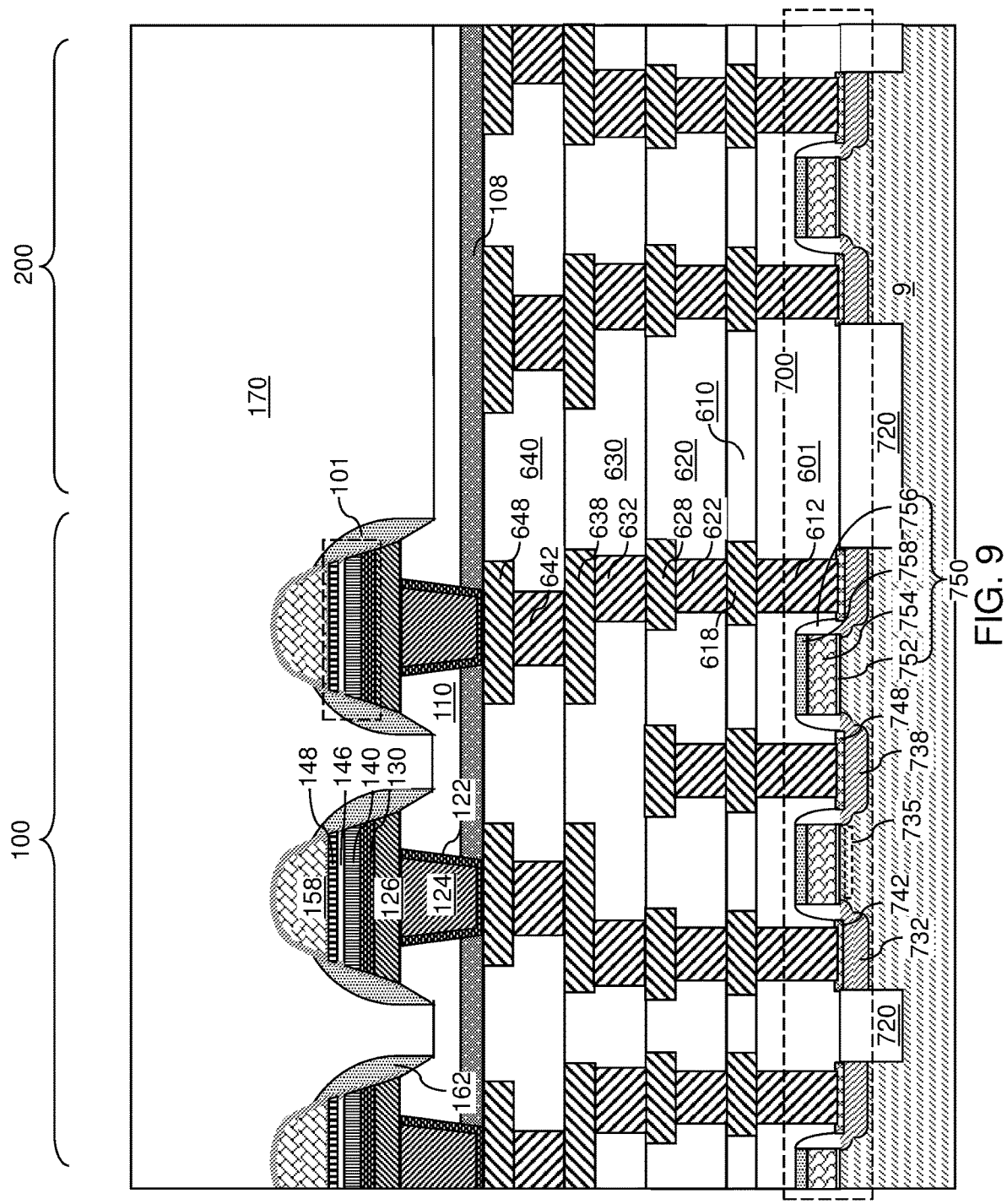
FIG. 9 is a vertical cross-sectional view of the exemplary structure after formation of a memory-level dielectric layer according to an embodiment of the present disclosure.

FIG. 9 is a vertical cross-sectional view of the exemplary structure after formation of a memory-level dielectric layer 170 according to an embodiment of the present disclosure. The memory-level dielectric layer 170 may be formed around, and over, the array of dielectric spacers 162 and the array of memory cells (158, 150). In one embodiment, the memory-level dielectric layer 170 laterally surrounds the dielectric spacers 162, and s laterally spaced from the pillar structures by the dielectric spacers 162. The memory-level dielectric layer 170 laterally surrounds, and embeds, each of the top electrodes 158. In one embodiment, the memory-level dielectric layer 170 includes a planarizable dielectric material such as undoped silicate glass or a doped silicate glass. The dielectric material of the memory-level dielectric layer 170 may be deposited by a conformal deposition process (such as a chemical vapor deposition process) or a self-planarizing deposition process (such as spin coating). The memory-level dielectric layer 170 may be formed with a planar top surface (for example, as formed by spin-coating), or the memory-level dielectric layer 170 may be planarized by a planarization process (such as a chemical mechanical planarization process) to provide a planar top surface. The minimum vertical distance between the planar top surface of the memory-level dielectric layer 170 and the top electrodes 158 may be in a range from 30 nm to 300 nm, although lesser and greater minimum vertical distances may also be used.

Figure 10:
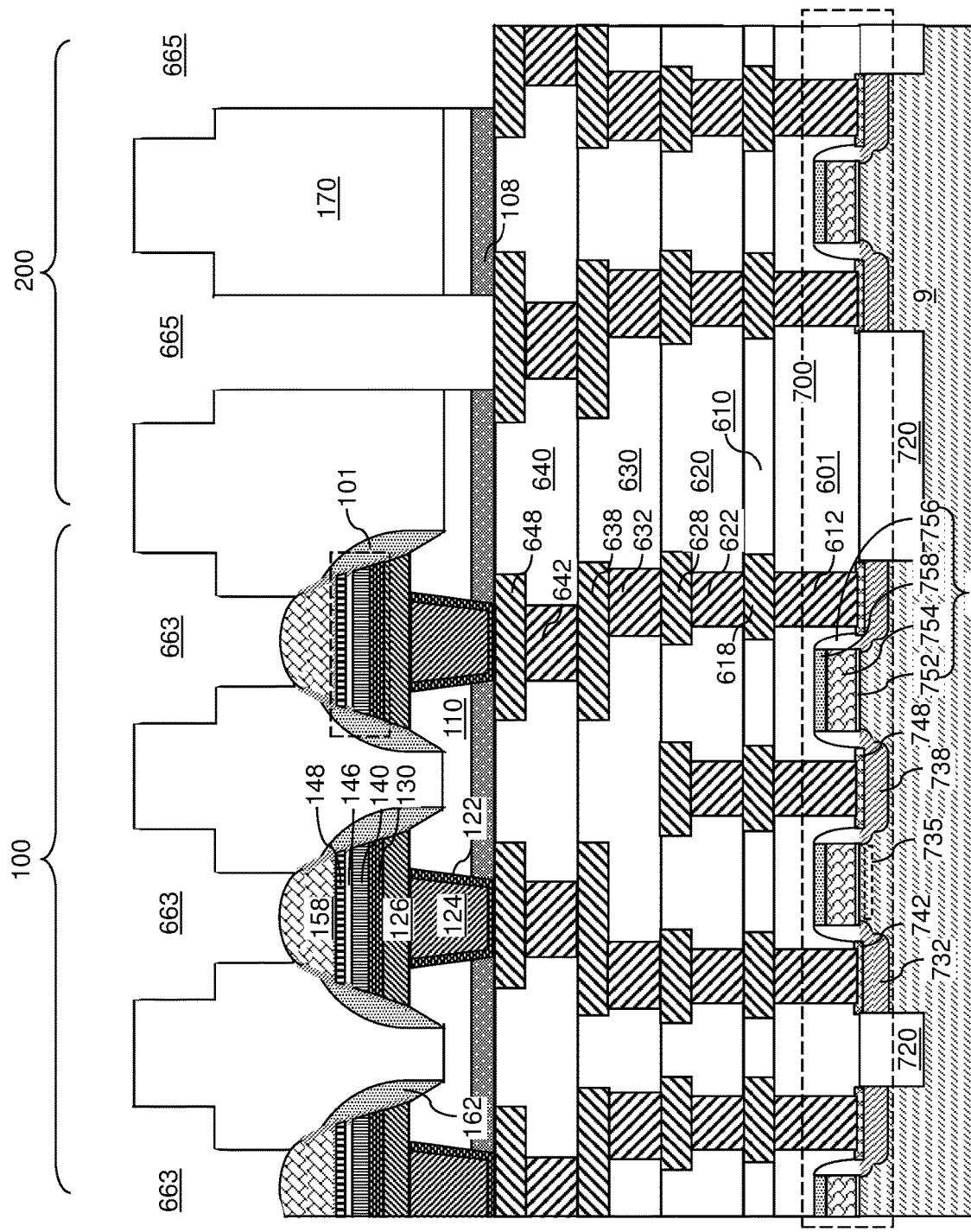
FIG. 10 is a vertical cross-sectional view of the exemplary structure after formation of integrated line and via cavities through the memory-level dielectric layer according to an embodiment of the present disclosure.

FIG. 10 is a vertical cross-sectional view of the exemplary structure after formation of integrated line and via cavities through the memory-level dielectric layer according to an embodiment of the present disclosure. At least one lithographic patterning step and at least one anisotropic etch process may be used for form memory-level interconnect cavities (663,665) in the memory-level dielectric layer 170. For example, a first photoresist layer (not shown) may be applied over the memory-level dielectric layer 170 and may be lithographically patterned to form an array of discrete openings in the first photoresist layer. A first anisotropic etch process may be performed to form via cavities in the memory-level dielectric layer 170. After removal of the first photoresist layer, a second photoresist layer (not shown) may be applied over the memory-level dielectric layer 170 and may be lithographically patterned to form line-shaped openings in the second photoresist layer. A second anisotropic etch process may be performed to form line cavities in the memory-level dielectric layer 170. The second photoresist layer may be subsequently removed.

First memory-level interconnect cavities 663 may be formed in the memory array region 100, and second memory-level interconnect cavities 665 may be formed in the peripheral region 200. In on embodiment, the memory-level interconnect cavities (663, 665) may be formed as integrated line and via cavities. In this embodiment, each integrated line and via cavity may include a line cavity that is located within an upper portion of the memory-level dielectric layer 170, and at least one via cavity adjoined to a bottom portion of the line cavity and vertically extends through an upper portion of the memory-level dielectric layer 170 and down to a top surface of an underlying metallic structure. Specifically, the first memory-level interconnect cavities 663 vertically extend through a top portion of a respective dielectric metal oxide layer 154, and a convex top surface of a top electrode 158 may be physically exposed at the bottom of each first memory-level interconnect cavity 663. The second memory-level interconnect cavities 665 vertically extend through the memory-level dielectric layer 170, the connection-via-level dielectric layer 110, and the dielectric cap layer 108, and a top surface of a metal line structure (such as a fourth metal line structure 648) may be physically exposed at the bottom of each second memory-level interconnect cavity 665. Generally, the first memory-level interconnect cavities 663 may vertically extend between the top surface of the memory-level dielectric layer 170 and a top surface of a respective one of the top electrodes 158, and the second memory-level interconnect cavities 665 may vertically extend between the top surface of the memory-level dielectric layer 170 and a top surface of a respective underlying metal interconnect structure.

Figure 11:
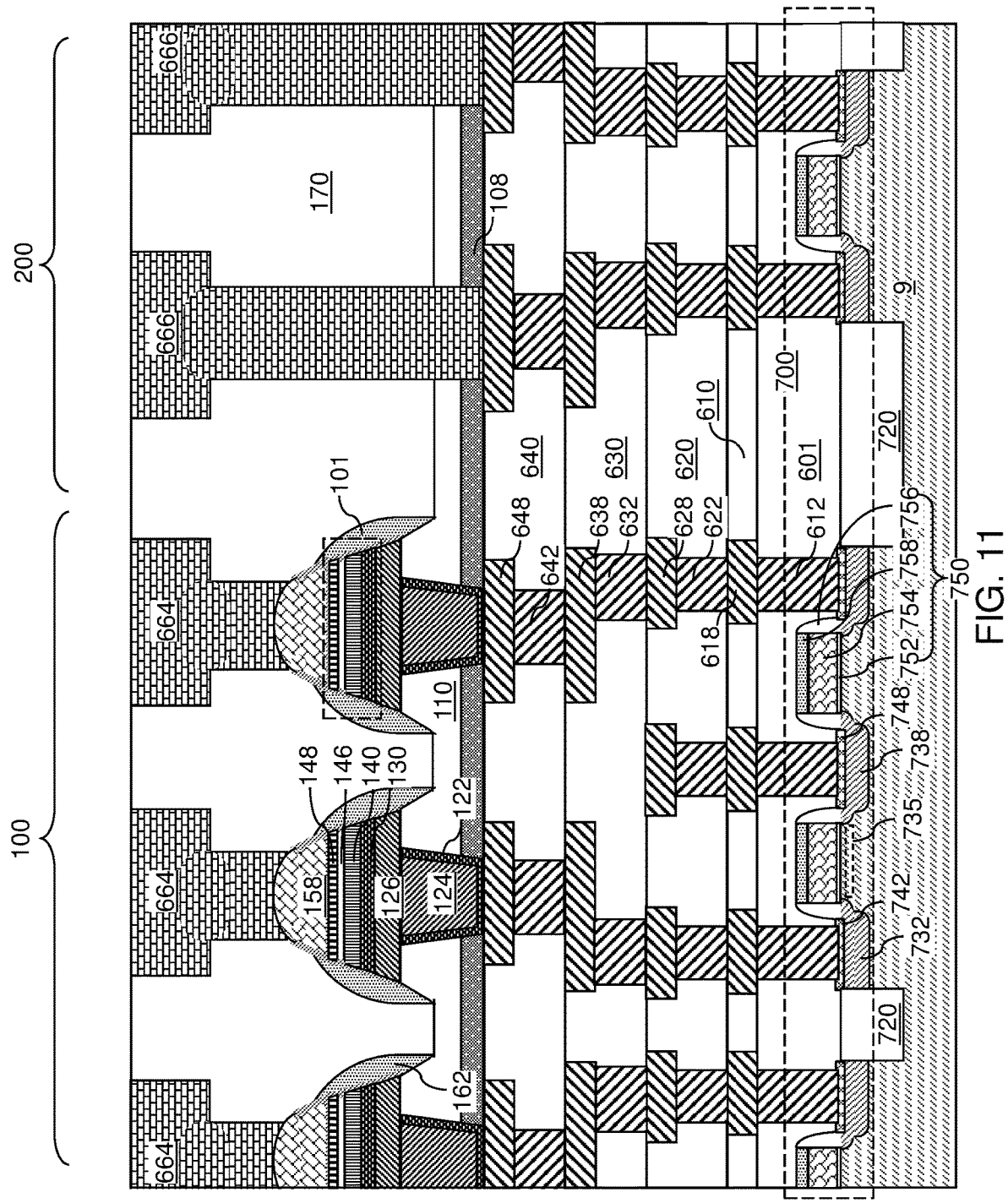
FIG. 11 is a vertical cross-sectional view of the exemplary structure after formation of memory-level metal interconnect structures according to an embodiment of the present disclosure.

FIG. 11 is a vertical cross-sectional view of the exemplary structure after formation of memory-level metal interconnect structures according to an embodiment of the present disclosure. At least one metallic material may be deposited in the memory-level interconnect cavities (663, 665). The at least one metallic material is herein referred to as memory-level metallic material. In one embodiment, a metallic barrier material layer (such as a TiN, layer, TaN layer, and/or a WN layer) and a metallic fill material (such as W, Cu, Co, Ru, Mo, or an intermetallic alloy) may be deposited in the memory-level interconnect cavities (663, 665) and over the memory-level dielectric layer 170.

A planarization process such as a chemical mechanical planarization process may be performed to remove the memory-level metallic material from above the memory-level dielectric layer 170. The chemical mechanical planarization process may remove the memory-level metallic material from above the horizontal plane including the top surface of the memory-level dielectric layer 170. Remaining portions of the memory-level metallic material filling the memory-level interconnect cavities (663, 665) comprise memory-level metal interconnect structures (664, 666). In one embodiment, the memory-level metal interconnect structures (664, 666) may include integrated line and via structures that includes a respective metal line and a respective set of at least one metal via structures. The metal lines of the memory-level metal interconnect structures (664, 666) may have top surfaces within the horizontal plane including the top surface of the memory-level dielectric layer 170.

The memory-level metal interconnect structures (664, 666) comprise first memory-level metal interconnect structures 664 and second memory-level metal interconnect structures 666. The first memory-level metal interconnect structures 664 may vertically extend through the memory-level dielectric layer 170, and may include a respective contact via structure that contacts a respective one of the top electrodes 158. The second memory-level metal interconnect structures 666 may vertically extend through the memory-level dielectric layer 170, and may include a respective via portion that contacts a respective one of the underlying metal interconnect structures. Generally, for each memory cell (158, 150) within a two-dimensional array of memory cells (158, 150), a contact via structure (which may comprise a portion of a first memory-level metal interconnect structure 664) contacts a convex top surface of a top electrode 158, and vertically extends through an opening in a dielectric metal oxide layer 154. Each contact via structure that contacts a top electrode 158 may extend through the memory-level dielectric layer 170, and may contact a convex top surface of the top electrode 158.

Additional metal interconnect structures (not shown) may be formed above the memory level, which vertically extends from the bottom surface of the dielectric cap layer 108 to the top surface of the memory-level dielectric layer. The additional metal interconnect structures may be embedded within additional dielectric material layers (not shown). The memory-level metal interconnect structures (664, 666) and the additional metal interconnect structures may be used to electrically connect the top electrodes 158 of the memory cells (158, 150) to a respective electrical node of the CMOS circuitry 700.

Data from tests on manufactured samples of the exemplary structure, as generated under the inventors' supervision, show a reduction in the bit error rate (caused by electrical shorts within memory cells (158, 150) by a factor of about 10-100 compared to data from reference samples in which the oxidation process that forms dielectric metal oxide layers were omitted. Thus, formation of the dielectric metal oxide layers 154 provides the beneficial effect of suppressing electrical shorts in the pillar structures 150.

Various embodiments may be derived from the above-described embodiment of the present disclosure by omitting one or more of the processing steps of FIGS. 6A-6D. Further, the order of the processing sequence of the processing steps of FIGS. 6B-6D may be altered with varying degrees of impact in overall effectiveness in removing electrical shorts between components of each memory cell (158, 150) and in improving electrical characteristics of each memory cell (158, 150).

FIGS. 12A-12E illustrate sequential vertical cross-sectional views of a memory cell (158, 150) during a second exemplary sequence of patterning processes according to an embodiment of the present disclosure. In the second exemplary sequence of patterning processes, the hard mask trim ion beam etch process may be performed prior to the angled ion beam bombardment process.

Figure 12A:
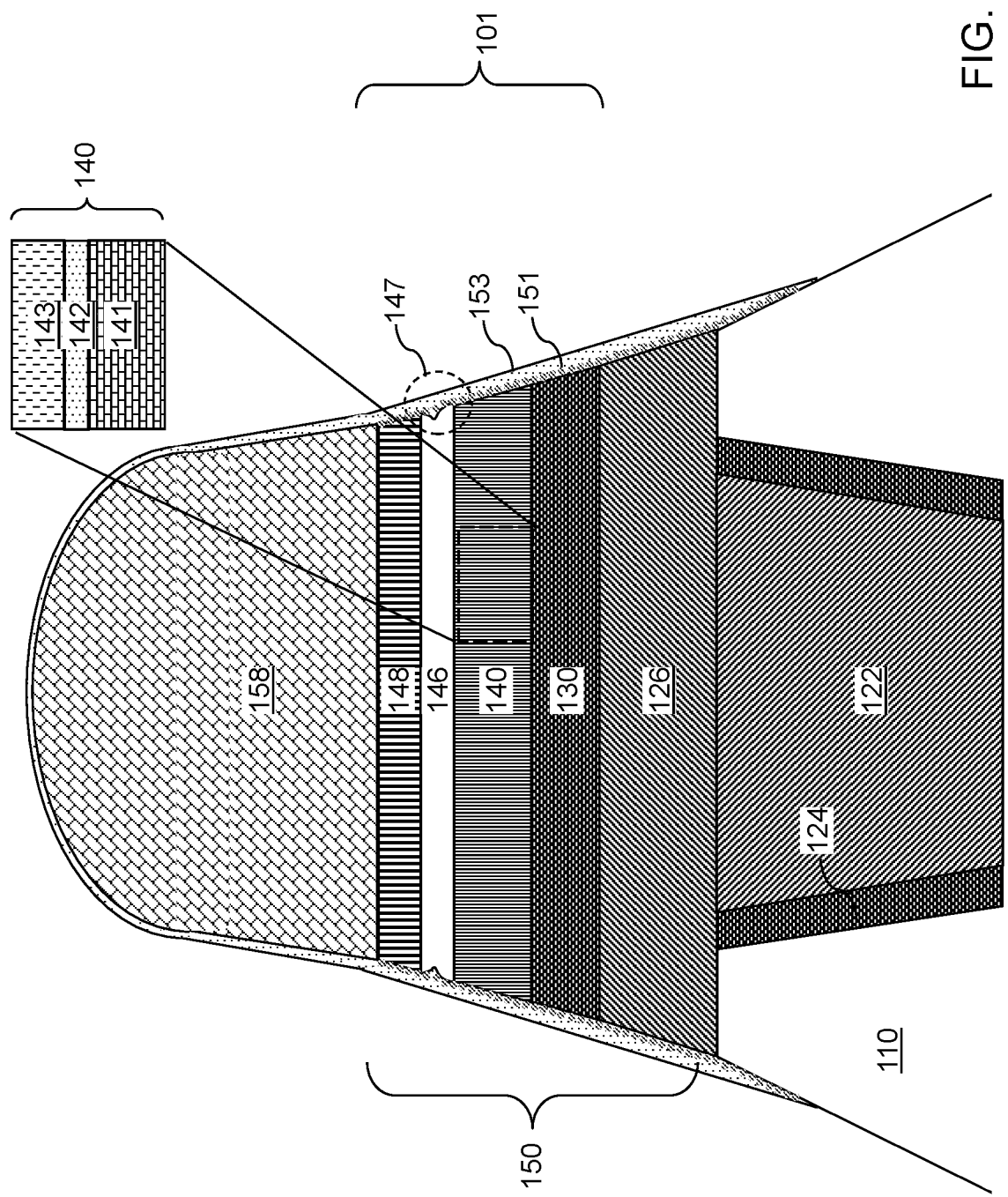
FIGS. 12A-12E illustrate sequential vertical cross-sectional views of a memory cell during a second exemplary sequence of patterning processes according to an embodiment of the present disclosure.

Referring to FIG. 12A, a memory cell (158, 150) is illustrated after the focused ion beam etch process, which corresponds to the processing step of FIG. 6A.

Figure 12B:
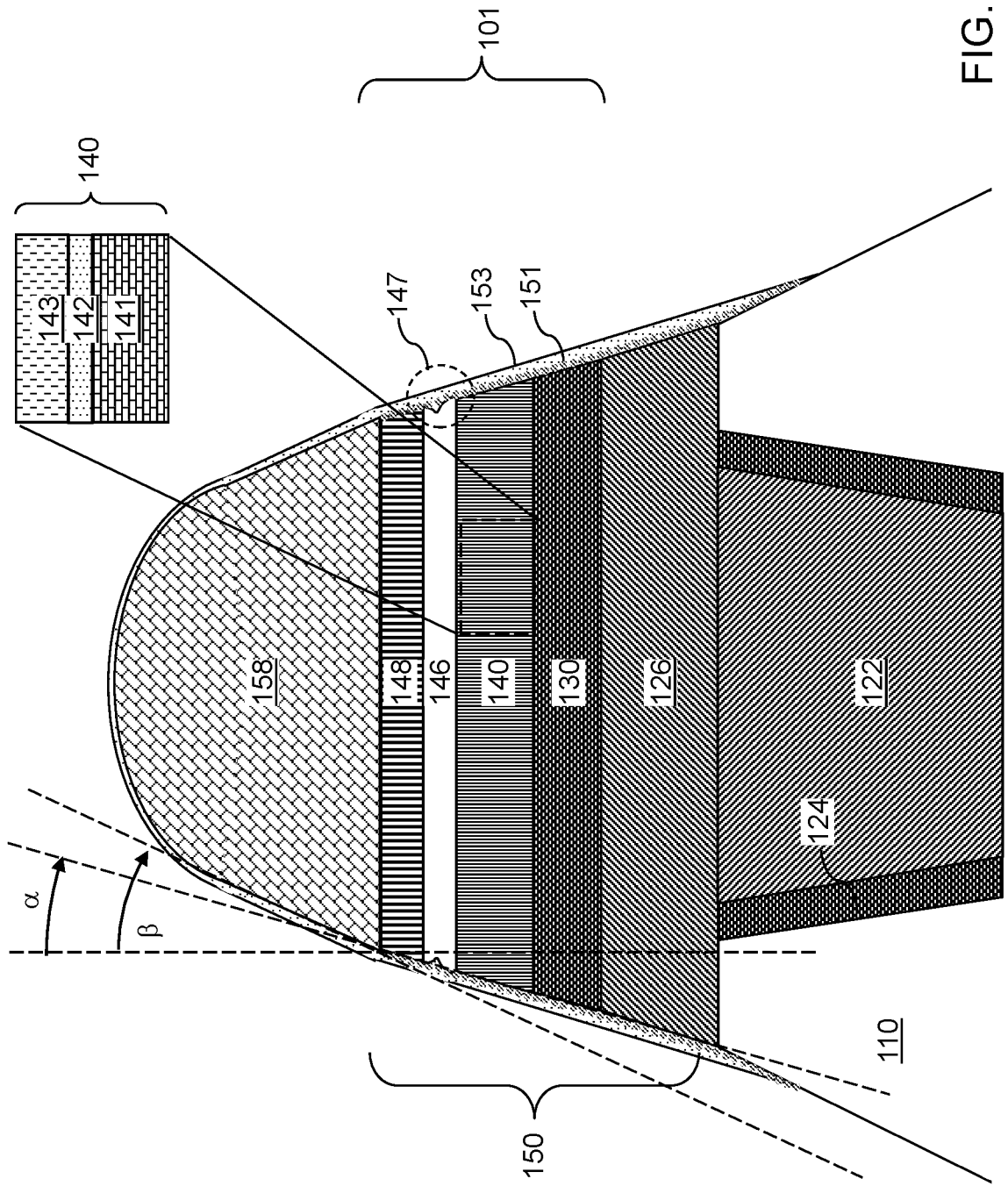

Referring to FIG. 12B and according to an aspect of the present disclosure, a hard mask trim ion beam etch process may be performed. The hard mask trim ion beam etch process may use a same set of process parameters as the hard mask trim ion beam etch process of FIG. 6D. Each top electrode 158 may have a tapered sidewall and a convex top surface. Generally, the convex top surface adjoins the tapered sidewall at an angle such that an annular boundary between the convex top surface and the tapered sidewall may be well defined. The tapered sidewalls of the top electrodes 158 are herein referred to as tapered electrode sidewalls. The average taper angle of the tapered sidewalls of the pillar structures 150 (i.e., the tapered pillar sidewalls) is herein referred to as a first average taper angle α. The average taper angle of the tapered sidewalls of the top electrodes 158 (i.e., the tapered electrode sidewalls) is herein referred to as a second average taper angle β. The first average taper angle α does not substantially change during the hard mask trim ion beam etch process. However, the second average taper angle β increases at least by 0.5 degree during the hard mask trim ion beam etch process. Typically, the second average taper angle β is the same as the first average taper angle α prior to the hard mask trim ion beam etch process. The increase in the second average taper angle β during the hard mask trim ion beam etch process may be in a range from 0.5 degree to 20 degree, such as from 3 degrees to 15 degrees. For example, the first average taper angle α after the hard mask trim ion beam etch process may be in a range from 8 degrees to 32 degrees, and the second average taper angle β after the hard mask trim ion beam etch process may be in a range from 2 degrees to 12 degrees.

Within each memory cell (158, 150), a top electrode 158 overlying a magnetic tunnel junction structure (143, 146, 148) includes a tapered electrode sidewall adjoining a pillar structure 150 and having the first average taper angle α with respect to the vertical direction (which is perpendicular to an interface with the pillar structure 150) after the hard mask trim ion beam etch process. The pillar structure 150 may have has a tapered pillar sidewall extending from the top surface of the pillar structure 150 to the bottom surface of the pillar structure 150, and the tapered pillar sidewall may have the second average taper angle β with respect to the vertical direction that is less than the first average taper angle α. The top periphery of the tapered pillar sidewall may coincide with the bottom periphery of the tapered electrode sidewall of the top electrode 158. The increase in the second average taper angle β has the advantageous effect of increasing the supply of oxygen source gas to the sidewalls of the pillar structures 150 during a subsequent plasma oxidation process, and of increasing the effectiveness of the subsequent plasma oxidation process.

Figure 12C:
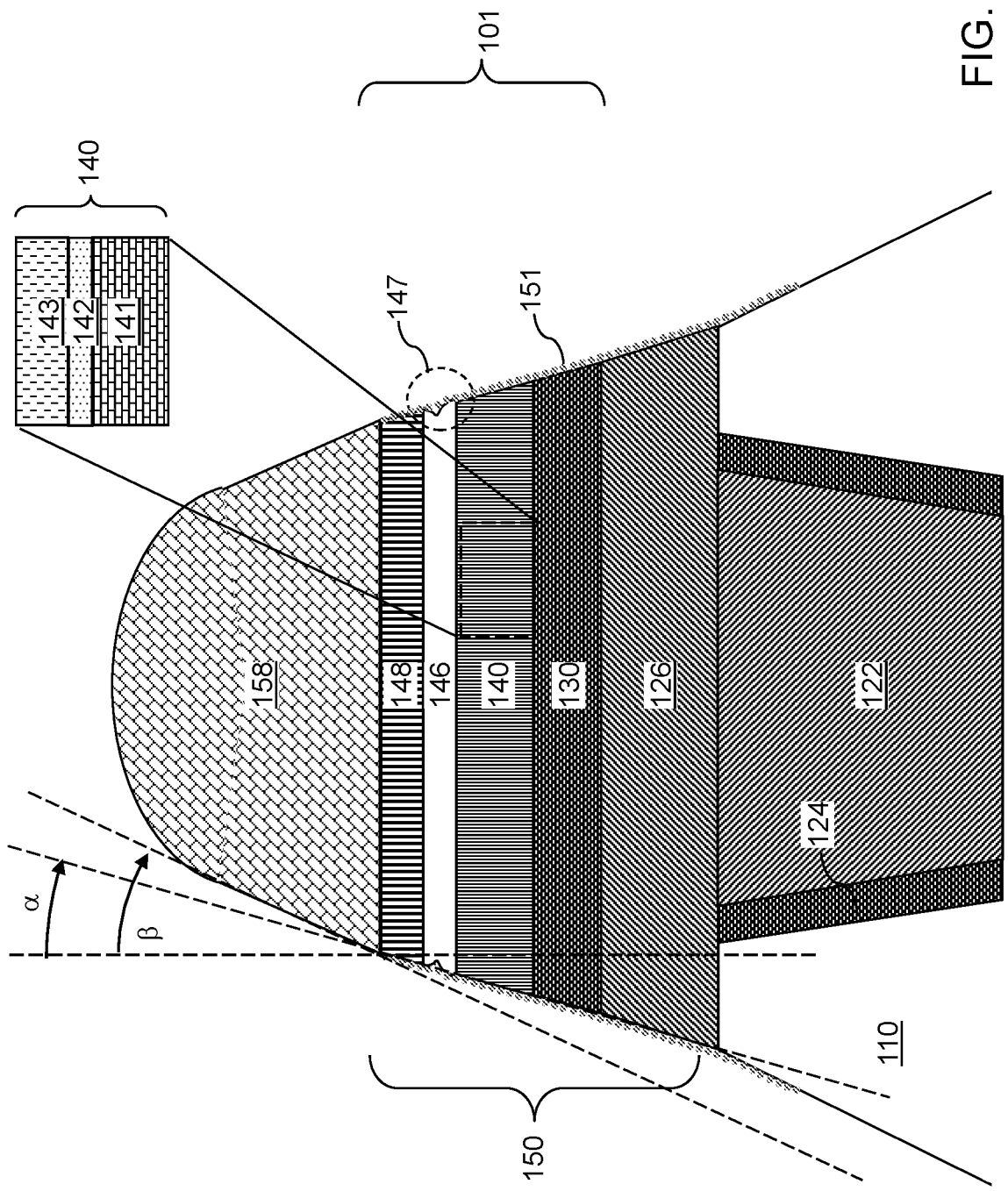

Referring to FIG. 12C and according to an aspect of the present disclosure, an angled ion beam bombardment process may be performed. The angled ion beam bombardment process of FIG. 12C may have the same set of process parameters as the angled ion beam bombardment process of FIG. 6B.

Figure 12D:
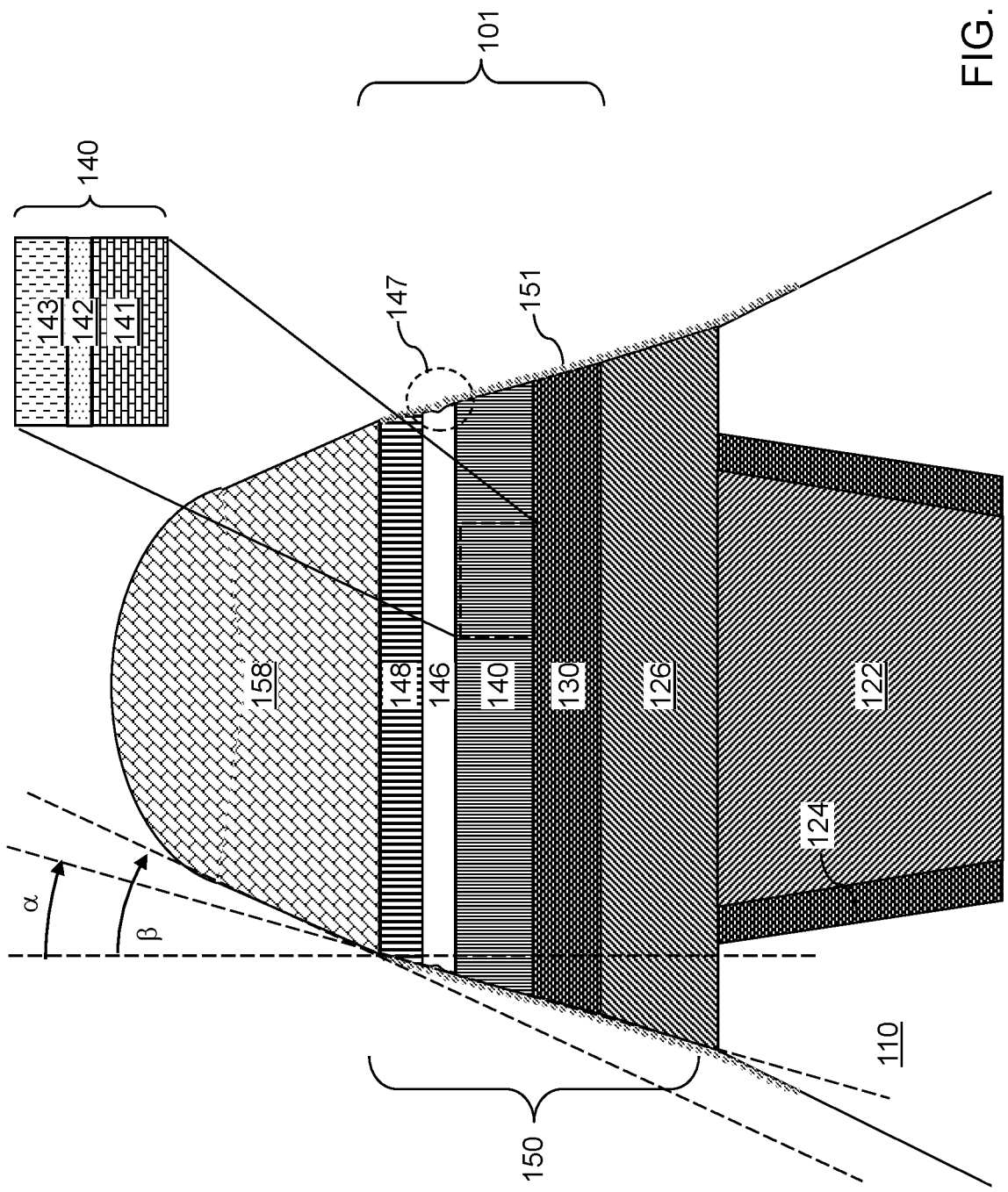

Referring to FIG. 12D and according to an aspect of the present disclosure, a recess reduction ion beam etch process may be performed. The recess reduction ion beam etch process of FIG. 12D may have the same set of process parameters as the recess reduction ion beam etch process of FIG. 6D.

Figure 12E:
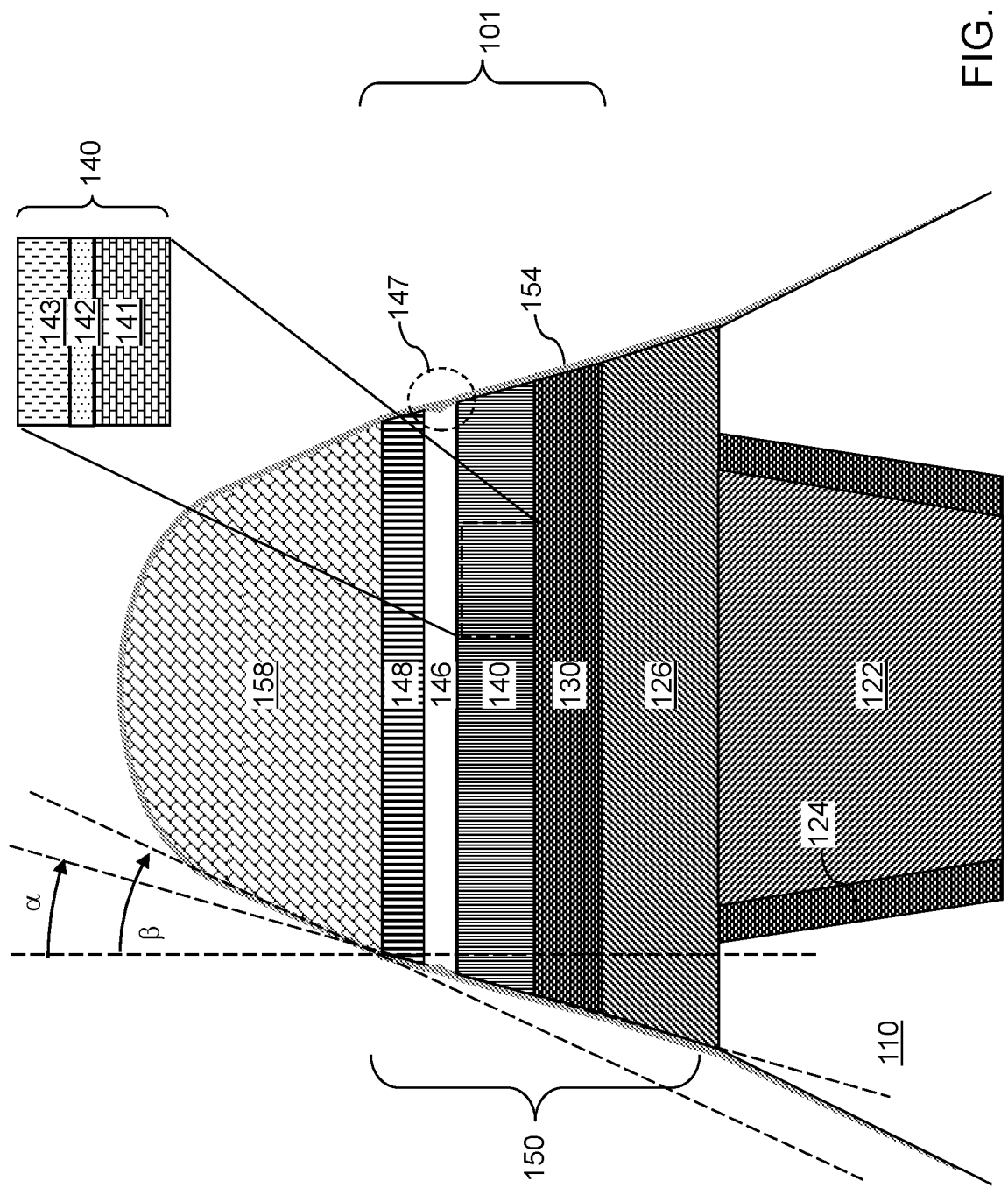

Referring to FIG. 12E and according to an aspect of the present disclosure, an oxidation process may be performed to convert the residual metal film 151, surface portions of the top electrodes 158, and surface portions of the metallic materials within the pillar structures 150 into a dielectric metal oxide layer 154. The oxidation process of FIG. 12E may have a same set of process parameters as the oxidation process of FIGS. 6E and 7.

Subsequently, the processing steps of FIGS. 8-11 may be performed to provide the exemplary structure illustrated in FIG. 11.

Figure 13B:
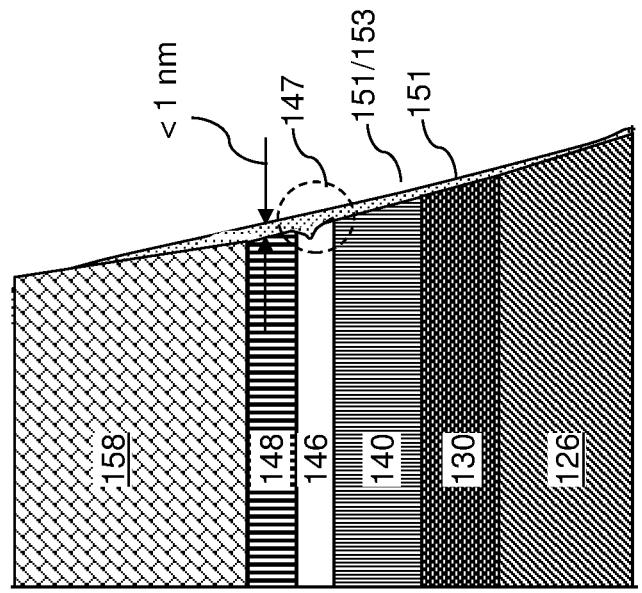
FIG. 13B is a schematic vertical cross-sectional view of a pillar structure after removal of a predominant portion of a residual byproduct layer according to an embodiment of the present disclosure.
Figure 13A:
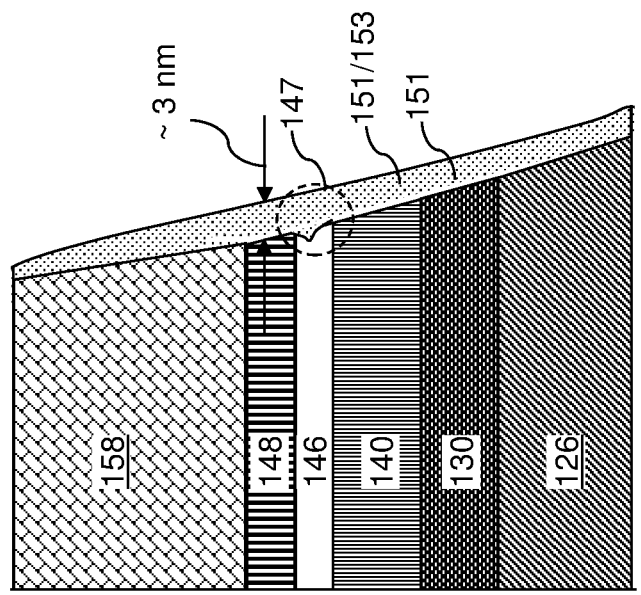
FIG. 13A is a schematic vertical cross-sectional view of a pillar structure after a focused ion beam etch process according to an embodiment of the present disclosure.

FIG. 13A is a schematic vertical cross-sectional view of a pillar structure after a focused ion beam etch process of the processing steps of FIGS. 5, 6A, and 12A according to an embodiment of the present disclosure. FIG. 13B is a schematic vertical cross-sectional view of a pillar structure after removal of a predominant portion of a residual byproduct layer by performing the angled ion beam bombardment process of FIG. 6B or FIG. 12C according to an embodiment of the present disclosure. The angled ion beam bombardment process provides the benefit of removing a predominant portion of a residual byproduct layer 153. In this example, the thickness of the residual byproduct layer 153 decreased from 3.3 nm to less than 1.0 nm.

Figure 14B:
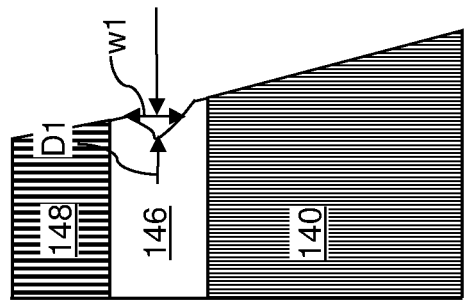
FIG. 14B is a schematic vertical cross-sectional view of a pillar structure after a recess reduction ion beam etch process according to an embodiment of the present disclosure.
Figure 14A:
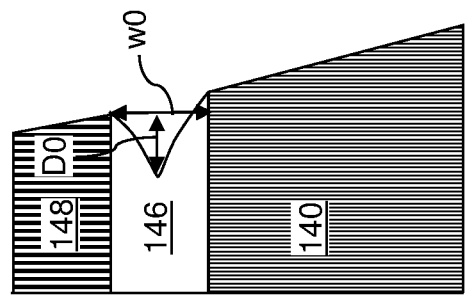
FIG. 14A is a schematic vertical cross-sectional view of a pillar structure after a focused ion beam etch process according to an embodiment of the present disclosure.

FIG. 14A is a schematic vertical cross-sectional view of a pillar structure after a focused ion beam etch process of the processing steps of FIGS. 5, 6A, and 12A according to an embodiment of the present disclosure. FIG. 14B is a schematic vertical cross-sectional view of a pillar structure after a recess reduction ion beam etch process of FIG. 6C or FIG. 12D according to an embodiment of the present disclosure. The recess reduction ion beam etch process provides the benefit of reducing the depth of an annular lateral recess 147 of a tunnel barrier layer 146. In this example, the annular lateral recess 147 of a tunnel barrier layer 146 had an initial depth D0 of about 3.0 nm and an initial width W0 of about 2.3 nm prior to the recess reduction ion beam etch process. The annular lateral recess 147 of the tunnel barrier layer 146 had a post-treatment depth D1 of about 2.3 nm and a post-treatment width W1 of about 2.0 nm after the recess reduction ion beam etch process. Thus, the volume of the annular lateral recess 147 decreased after the recess reduction ion beam etch process. Reduction in the volume of the annular lateral recess 147 reduces anomalous peripheral effects within the tunnel barrier layer 146, and improves electrical characteristics of the magnetic tunnel junction structure (143, 146, 148) in a memory cell (158, 150).

Figure 15:
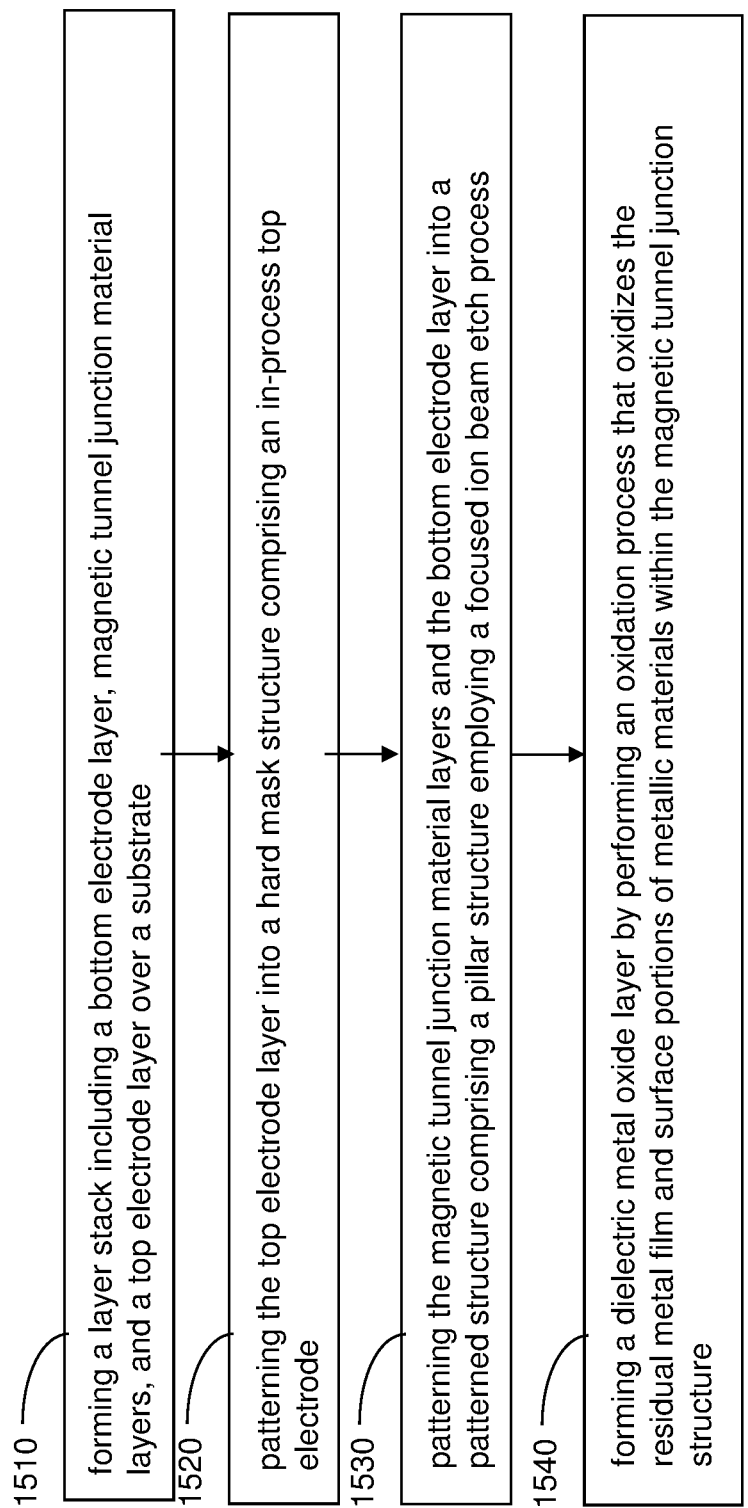
FIG. 15 is a first flowchart that illustrates a first sequence of processing steps for manufacturing a magnetic tunnel junction device of the present disclosure.

FIG. 15 is a first flowchart that illustrates a first sequence of processing steps for manufacturing a magnetic tunnel junction device of the present disclosure. The first sequence omits optional processing steps of FIGS. 6B-6D or FIGS. 12B-12D. Referring to step 1510 and FIGS. 1-3, a layer stack including a bottom electrode material layer 126L, magnetic tunnel junction material layers (143, 146L, 148L), and a top electrode material layer 158L may be formed over a substrate 9. The top electrode material layer 158L comprises a metallic material containing a nonmagnetic metal element. Referring to step 1520 and FIG. 4, the top electrode material layer 158L may be patterned into a hard mask structure comprising a top electrode 158 (such as a two-dimensional array of top electrodes 158). Referring to step 1530 and FIGS. 5, 6A, and 12A, the magnetic tunnel junction material layers (143, 146L, 148L) and the bottom electrode material layer 126L are patterned into a patterned structure comprising a pillar structure 150 (such as a two-dimensional array of pillar structures 150) using a focused ion beam etch process. The pillar structure 150 comprises a bottom electrode 126 and a magnetic tunnel junction structure (143, 146, 148). Surface portions of the top electrode 158 are etched during the focused ion beam etch process. A residual metal film 151 containing the nonmagnetic metal element is present on a sidewall of the pillar structure 150. Referring to steps 1540 and FIGS. 6E, 7, and 12E, a dielectric metal oxide layer 154 may be formed by performing an oxidation process that oxidizes the residual metal film 151 and surface portions of metallic materials within the magnetic tunnel junction structure (143, 146, 148) and the top electrode 158.

FIG. 15 is a second flowchart that illustrates a second sequence of processing steps for manufacturing a magnetic tunnel junction device of the present disclosure. The second sequence incorporates the optional processing steps of FIGS. 6B-6D or FIGS. 12B-12D. As such, the second sequence may be derived from the first sequence by adding steps 1610, 1620, and 1630 between step 1530 an step 1540. It is understood that only one or only two of the three optional steps may be added. Further, it is understood that the order of the optional processing steps may be reversed between any pair of optional processing steps. Referring step 1610 and FIGS. 6B and 12C, a hard mask trim ion beam etch process may be added to the first sequence of processing steps shown in FIG. 14. Referring to step 1620 and FIGS. 6C and 12D, an angled ion beam bombardment process may be added to the first sequence of processing steps shown in FIG. 14. Referring to step 1630 and FIGS. 6D and 12B, a recess reduction ion beam etch process may be added to the first sequence of processing steps shown in FIG. 14.

Referring to all drawings and according to various embodiments of the present disclosure, a magnetic tunnel junction device is provided, which comprises: a pillar structure 150 comprising, from bottom to top, a bottom electrode 126 and a magnetic tunnel junction structure (143, 146, 148) that contains a reference magnetization layer 143 including a first ferromagnetic material, a tunnel barrier layer 146, and a free magnetization layer 148 including a second ferromagnetic material; a top electrode 158 overlying the magnetic tunnel junction structure (143, 146, 148) and comprising a metallic material containing a nonmagnetic metal element; and a dielectric metal oxide layer 154 extending from a sidewall of the pillar structure 150 to a sidewall of the top electrode 158, wherein a lower portion of the dielectric metal oxide layer 154 contacting the sidewall of the pillar structure 150 comprises a composite dielectric metal oxide material containing a metal oxide of the first ferromagnetic material, a metal oxide of the second ferromagnetic material, and a metal oxide of the nonmagnetic metal element.

In one embodiment, an average molar fraction of the metal oxide of the nonmagnetic metal element within the lower portion of the dielectric metal oxide layer 154 is in a range from 0.001 to 0.5. In one embodiment, an upper portion of the dielectric metal oxide layer 154 contacting the top electrode 158 comprises the metal oxide of the nonmagnetic metal element at an average molar fraction in a range from 0.9 to 1.0. In one embodiment, the lower portion of the dielectric metal oxide layer 154 has a compositional modulation along a vertical direction; and a peak in a molar fraction of the metal oxide of the nonmagnetic metal element within the lower portion of the dielectric metal oxide layer 154 is between a horizontal plane including a top surface of the tunnel barrier layer 146 and a horizontal plane including a bottom surface of the tunnel barrier layer 146.

In one embodiment, the magnetic tunnel junction device comprises a contact via structure (which may comprise a portion of a first memory-level metal interconnect structure 664 or as a stand-alone metal via structure) contacting a convex top surface of the top electrode 158 and vertically extending through an opening in the dielectric metal oxide layer 154.

In one embodiment, the magnetic tunnel junction device comprises: a connection-via-level dielectric layer 110 underlying the pillar structure 150 and comprising a mesa portion protruding upward from a planar portion of the connection-via-level dielectric layer 110 and contacting an annular portion of a bottom surface of the pillar structure 150; and a connection via structure (122, 124) embedded within the mesa portion and contacting a center portion of the bottom surface of the pillar structure 150. In one embodiment, a bottom portion of the dielectric metal oxide layer 154 extends over an upper portion of a tapered sidewall of the mesa portion of the connection-via-level dielectric layer 110; and the bottom portion of the dielectric metal oxide layer 154 comprises the metal oxide of the nonmagnetic metal element at an average molar fraction in a range from 0.2 to 1.0.

In one embodiment, the tunnel barrier layer 146 has a bird's beak profile in a vertical cross-sectional view in which a portion of a sidewall of the tunnel barrier layer 146 is laterally recessed inward to provide an annular lateral recess 147; and the dielectric metal oxide layer 154 at least partially fills the annular lateral recess 147 such that an outer sidewall of the dielectric metal oxide layer 154 has a lesser lateral undulation over the tunnel barrier layer 146 in a vertical cross-sectional profile than an inner sidewall of the dielectric metal oxide layer 154 that contacts the tunnel barrier layer 146 has in the vertical cross-sectional profile.

In one embodiment, the magnetic tunnel junction device comprises: a dielectric spacer 162 laterally surrounding the pillar structure 150; and a memory-level dielectric layer 170 laterally surrounding the dielectric spacer 162 and laterally spaced from the pillar structure by the dielectric metal oxide layer 154 and the dielectric spacer 162.

According to another aspect of the present disclosure, a magnetic tunnel junction device is provided, which comprises: a pillar structure 150 comprising, from bottom to top, a bottom electrode 126 and a magnetic tunnel junction structure (143, 146, 148) that contains a reference magnetization layer 143 including a first ferromagnetic material, a tunnel barrier layer 146, and a free magnetization layer 148 including a second ferromagnetic material; and a top electrode 158 overlying the magnetic tunnel junction structure (143, 146, 148) and including a tapered electrode sidewall adjoining the pillar structure 150 and having a first average taper angle $\alpha$ with respect to a vertical direction that is perpendicular to an interface with the pillar structure 150, wherein: the pillar structure 150 has a tapered pillar sidewall extending from a top surface of the pillar structure 150 to a bottom surface of the pillar structure 150; and the tapered pillar sidewall has a second average taper angle $\beta$ with respect to the vertical direction that is less than the first average taper angle $\alpha$. In one embodiment, the first average taper angle $\alpha$ is in a range from 8 degrees to 32 degrees; and the second average taper angle $\beta$ is in a range from 2 degrees to 12 degrees.

In one embodiment, the top electrode 158 comprises a metallic material containing a nonmagnetic metal element; a dielectric metal oxide layer 154 extends over the tapered electrode sidewall and the tapered pillar sidewall; and a lower portion of the dielectric metal oxide layer 154 contacting the tapered pillar sidewall comprises a composite dielectric metal oxide material containing a metal oxide of the first ferromagnetic material, a metal oxide of the second ferromagnetic material, and a metal oxide of the nonmagnetic metal element.

In one embodiment, the magnetic tunnel junction device comprises: a memory-level dielectric layer 170 laterally surrounding the top electrode 158; a contact via structure (which may comprise a via portion within a first memory-level metal interconnect structure 664 or as a stand-alone metal via structure) extending through the memory-level dielectric layer 170 and contacting a convex top surface of the top electrode 158; a connection-via-level dielectric layer 110 underlying the pillar structure 150 and comprising a mesa portion protruding upward from a planar portion of the connection-via-level dielectric layer 110 and contacting an annular portion of a bottom surface of the pillar structure 150; and a connection via structure (122, 124) embedded within the mesa portion and contacting a center portion of the bottom surface of the pillar structure 150, wherein the mesa portion has a tapered sidewall adjoined to the tapered pillar sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic tunnel junction device comprising:
   a pillar structure comprising, from bottom to top, a bottom electrode and a magnetic tunnel junction structure that contains a reference magnetization layer including a first ferromagnetic material, a tunnel barrier layer, and a free magnetization layer including a second ferromagnetic material;
   a top electrode overlying the magnetic tunnel junction structure and comprising a metallic material containing a nonmagnetic metal element; and
   a dielectric metal oxide layer extending from a sidewall of the pillar structure to a sidewall of the top electrode, wherein a lower portion of the dielectric metal oxide layer contacting the sidewall of the pillar structure comprises a composite dielectric metal oxide material containing a metal oxide of the first ferromagnetic material, a metal oxide of the second ferromagnetic material, and a metal oxide of the nonmagnetic metal element, wherein an average molar fraction of the metal oxide of the nonmagnetic metal element within the lower portion of the dielectric metal oxide layer is in a range from 0.001 to 0.5.

2. The magnetic tunnel junction device of claim 1, wherein an upper portion of the dielectric metal oxide layer contacting the top electrode comprises the metal oxide of the nonmagnetic metal element at an average molar fraction in a range from 0.9 to 1.0.

3. The magnetic tunnel junction device of claim 1, wherein:
   the lower portion of the dielectric metal oxide layer has a compositional modulation along a vertical direction; and
   a peak in a molar fraction of the metal oxide of the nonmagnetic metal element within the lower portion of the dielectric metal oxide layer is between a horizontal plane including a top surface of the tunnel barrier layer and a horizontal plane including a bottom surface of the tunnel barrier layer.

4. The magnetic tunnel junction device of claim 1, further comprising a contact via structure contacting a convex top surface of the top electrode and vertically extending through an opening in the dielectric metal oxide layer.

5. The magnetic tunnel junction device of claim 1, further comprising:
   a connection-via-level dielectric layer underlying the pillar structure and comprising a mesa portion protruding upward from a planar portion of the connection-via-level dielectric layer and contacting an annular portion of a bottom surface of the pillar structure; and
   a connection via structure embedded within the mesa portion and contacting a center portion of the bottom surface of the pillar structure.

6. The magnetic tunnel junction device of claim 5, wherein:
   a bottom portion of the dielectric metal oxide layer extends over an upper portion of a tapered sidewall of the mesa portion of the connection-via-level dielectric layer; and
   the bottom portion of the dielectric metal oxide layer comprises the metal oxide of the nonmagnetic metal element at an average molar fraction in a range from 0.2 to 1.0.

7. The magnetic tunnel junction device of claim 1, wherein:
   the tunnel barrier layer has a bird's beak profile in a vertical cross-sectional view in which a portion of a sidewall of the tunnel barrier layer is laterally recessed inward to provide an annular lateral recess; and
   the dielectric metal oxide layer at least partially fills the annular lateral recess such that an outer sidewall of the dielectric metal oxide layer has a lesser lateral undulation over the tunnel barrier layer in a vertical cross-sectional profile than an inner sidewall of the dielectric metal oxide layer that contacts the tunnel barrier layer has in the vertical cross-sectional profile.

8. The magnetic tunnel junction device of claim 1, further comprising:
   a dielectric spacer laterally surrounding the pillar structure; and
   a memory-level dielectric layer laterally surrounding the dielectric spacer and laterally spaced from the pillar structure by the dielectric metal oxide layer and the dielectric spacer.

9. The magnetic tunnel junction device of claim 1, wherein:
   the pillar structure has a tapered pillar sidewall extending from a top surface of the pillar structure to a bottom surface of the pillar structure and having a first average taper angle with respect to a vertical direction;
   the top electrode has a second first average taper angle with respect to the vertical direction which is greater than the first average taper angle;
   the second average taper angle is in a range from 8 degrees to 32 degrees; and
   the first average taper angle is in a range from 2 degrees to 12 degrees.

10. A magnetic tunnel junction device comprising:
    a pillar structure comprising, from bottom to top, a bottom electrode and a magnetic tunnel junction structure that contains a reference magnetization layer including a first ferromagnetic material, a tunnel barrier layer, and a free magnetization layer including a second ferromagnetic material, wherein the pillar structure has a tapered pillar sidewall extending from a top surface of the pillar structure to a bottom surface of the pillar structure and having a first average taper angle with respect to a vertical direction; and
    a top electrode overlying the magnetic tunnel junction structure and including a tapered electrode sidewall adjoining the pillar structure and having a second average taper angle with respect to the vertical direction, wherein the second average taper angle is greater than the first average taper angle, wherein:
    the second average taper angle is in a range from 8 degrees to 32 degrees; and the first average taper angle is in a range from 2 degrees to 12 degrees.

11. The magnetic tunnel junction device of claim 10, wherein:
the top electrode comprises a metallic material containing a nonmagnetic metal element;
a dielectric metal oxide layer extends over the tapered electrode sidewall and the tapered pillar sidewall; and
a lower portion of the dielectric metal oxide layer contacting the tapered pillar sidewall comprises a composite dielectric metal oxide material containing a metal oxide of the first ferromagnetic material, a metal oxide of the second ferromagnetic material, and a metal oxide of the nonmagnetic metal element.

12. The magnetic tunnel junction device of claim 11, wherein an average molar fraction of the metal oxide of the nonmagnetic metal element within the lower portion of the dielectric metal oxide layer is in a range from 0.001 to 0.5.

13. The magnetic tunnel junction device of claim 10, further comprising:
a memory-level dielectric layer laterally surrounding the top electrode;
a contact via structure extending through the memory-level dielectric layer and contacting a convex top surface of the top electrode;
a connection-via-level dielectric layer underlying the pillar structure and comprising a mesa portion protruding upward from a planar portion of the connection-via-level dielectric layer and contacting an annular portion of a bottom surface of the pillar structure; and
a connection via structure embedded within the mesa portion and contacting a center portion of the bottom surface of the pillar structure,
wherein the mesa portion has a tapered sidewall adjoined to the tapered pillar sidewall.

14. A magnetic tunnel junction device comprising:
a pillar structure comprising, from bottom to top, a bottom electrode and a magnetic tunnel junction structure that contains a reference magnetization layer including a first ferromagnetic material, a tunnel barrier layer, and a free magnetization layer including a second ferromagnetic material;
a top electrode overlying the magnetic tunnel junction structure; and
a dielectric metal oxide layer comprising a composite dielectric metal oxide material containing a metal oxide of the first ferromagnetic material, a metal oxide of the second ferromagnetic material, and a metal oxide of the nonmagnetic metal element and contacting a sidewall of the pillar structure, wherein an average fraction of the metal oxide of the nonmagnetic metal element within a lower portion of the dielectric metal oxide layer that contacts the sidewall of the pillar structure is in a range from 0.001 to 0.5.

15. The magnetic tunnel junction device of claim 14, wherein the tunnel barrier layer is laterally recessed inward to provide an annular lateral recess that azimuthally extends around an entire sidewall of the tunnel barrier layer.

16. The magnetic tunnel junction device of claim 15, wherein the dielectric metal oxide layer at least partially fills, and/or completely fills, the annular lateral recess.

17. The magnetic tunnel junction device of claim 16, wherein an outer sidewall of the dielectric metal oxide layer has a lesser lateral undulation over the tunnel barrier layer in a vertical cross-sectional profile than an inner sidewall of the dielectric metal oxide layer that contacts the tunnel barrier layer has in the vertical cross-sectional profile.

18. The magnetic tunnel junction device of claim 14, wherein an upper portion of the dielectric metal oxide layer contacting the top electrode comprises the metal oxide of the nonmagnetic metal element at an average molar fraction in a range from 0.9 to 1.0.

19. The magnetic tunnel junction device of claim 14, wherein:
the tunnel barrier layer has a bird's beak profile in a vertical cross-sectional view in which a portion of a sidewall of the tunnel barrier layer is laterally recessed inward to provide an annular lateral recess; and
the dielectric metal oxide layer at least partially fills the annular lateral recess such that an outer sidewall of the dielectric metal oxide layer has a lesser lateral undulation over the tunnel barrier layer in a vertical cross-sectional profile than an inner sidewall of the dielectric metal oxide layer that contacts the tunnel barrier layer has in the vertical cross-sectional profile.

20. The magnetic tunnel junction device of claim 14, wherein:
the pillar structure has a tapered pillar sidewall extending from a top surface of the pillar structure to a bottom surface of the pillar structure and having a first average taper angle with respect to a vertical direction;
the top electrode has a second first average taper angle with respect to the vertical direction which is greater than the first average taper angle;
the second average taper angle is in a range from 8 degrees to 32 degrees; and
the first average taper angle is in a range from 2 degrees to 12 degrees.

* * * * *